(12) United States Patent
Cheon et al.

(10) Patent No.: US 10,094,063 B2
(45) Date of Patent: *Oct. 9, 2018

(54) LAUNDRY TREATING APPARATUS AND METHOD OF FABRICATING A LAUNDRY TREATING APPARATUS DOOR

(71) Applicant: LG ELECTRONICS INC., Seoul (KR)

(72) Inventors: Kangwoon Cheon, Seoul (KR); Seungji Yong, Seoul (KR); Yongwoo Kwon, Seoul (KR); Jaehoon Choi, Seoul (KR); Junyoung Son, Seoul (KR); Hongchul Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/340,235

(22) Filed: Nov. 1, 2016

(65) Prior Publication Data

US 2017/0121891 A1    May 4, 2017

Related U.S. Application Data

(60) Provisional application No. 62/249,355, filed on Nov. 2, 2015.

(30) Foreign Application Priority Data

Jan. 5, 2016  (KR) ........................ 10-2016-0001216
Apr. 1, 2016  (KR) ........................ 10-2016-0040452

(51) Int. Cl.
*G06F 3/041*    (2006.01)
*D06F 39/00*    (2006.01)
(Continued)

(52) U.S. Cl.
CPC ............ *D06F 39/005* (2013.01); *D06F 33/02* (2013.01); *D06F 37/18* (2013.01); *D06F 37/266* (2013.01);
(Continued)

(58) Field of Classification Search
CPC ..................................................... G06F 3/0416
See application file for complete search history.

(56) References Cited

U.S. PATENT DOCUMENTS 3,042,471 A   7/1962  Haslup
5,358,773 A   10/1994 Fujii et al.
(Continued)

FOREIGN PATENT DOCUMENTS

CN    1936157    3/2007
CN    2898087    5/2007
(Continued)

OTHER PUBLICATIONS

European Search Report dated Mar. 29, 2017 issued in Application No. 16196148.7.
(Continued)

*Primary Examiner* — Towfiq Elahi
(74) *Attorney, Agent, or Firm* — KED & Associates, LLP

(57) ABSTRACT

A laundry treating apparatus includes a main body having a laundry introduction opening, and a door capable of opening and closing the laundry introduction opening, wherein the door includes a door cover defining an appearance of the door, and provided with a transparent region and an opaque region surrounding the transparent region, a display module disposed on a rear surface of the door cover and capable of outputting visual information through the transparent region, and a touch sensor attached to a rear surface of the door cover to cover the transparent region and capable of sensing a touch input applied to the transparent region, wherein the (Continued)

touch sensor is provided with an align mark to allow the touch sensor to be attached to a correct position with respect to the transparent region.

8 Claims, 18 Drawing Sheets

(51) Int. Cl.
| | |
|---|---|
| *D06F 33/02* | (2006.01) |
| *D06F 37/18* | (2006.01) |
| *D06F 37/30* | (2006.01) |
| *D06F 39/02* | (2006.01) |
| *D06F 37/26* | (2006.01) |
| *D06F 58/28* | (2006.01) |
| *G05B 19/409* | (2006.01) |
| *H05K 1/02* | (2006.01) |

(52) U.S. Cl.
CPC ............ *D06F 37/304* (2013.01); *D06F 39/02* (2013.01); *D06F 58/28* (2013.01); *G05B 19/409* (2013.01); *G06F 3/0416* (2013.01); *H05K 1/028* (2013.01); *D06F 2058/2883* (2013.01); *G05B 2219/23023* (2013.01); *G05B 2219/23058* (2013.01); *G05B 2219/2633* (2013.01); *G06F 2203/04103* (2013.01); *G06F 2203/04107* (2013.01)

(56) References Cited

U.S. PATENT DOCUMENTS

| | | |
|---|---|---|
| 8,151,603 B2 | 4/2012 | Kang et al. |
| 9,268,068 B2 | 2/2016 | Lee |
| 9,708,749 B2 | 7/2017 | Woo et al. |
| 9,810,590 B2 | 11/2017 | Huppi et al. |
| 2006/0059710 A1 | 3/2006 | Kim |
| 2006/0117813 A1 | 6/2006 | Ha et al. |
| 2006/0218975 A1 | 10/2006 | Graute et al. |
| 2008/0273016 A1 | 11/2008 | Helgesen |
| 2009/0064534 A1 | 3/2009 | LeClerc |
| 2009/0121970 A1 | 5/2009 | Ozbek |
| 2010/0187023 A1 | 7/2010 | Min |
| 2010/0245271 A1 | 9/2010 | Park |
| 2011/0296628 A1 | 12/2011 | Jenkins et al. |
| 2012/0036900 A1* | 2/2012 | Hong .................... D06F 39/005 68/139 |
| 2012/0049703 A1 | 3/2012 | Fang et al. |
| 2013/0076220 A1 | 3/2013 | Yeom et al. |
| 2013/0234573 A1 | 9/2013 | Coxon |
| 2014/0016290 A1* | 1/2014 | Lee ......................... G06F 3/041 361/792 |
| 2014/0063367 A1 | 3/2014 | Yang et al. |
| 2014/0157673 A1 | 6/2014 | Bazzinotti |
| 2015/0123525 A1 | 5/2015 | Woo et al. |
| 2017/0121886 A1 | 5/2017 | Kwon et al. |
| 2017/0121898 A1 | 5/2017 | Kwon et al. |

FOREIGN PATENT DOCUMENTS

| | | |
|---|---|---|
| CN | 101096810 | 1/2008 |
| CN | 201103058 | 8/2008 |
| CN | 101805979 | 8/2010 |
| CN | 101818439 | 9/2010 |
| CN | 102191653 | 9/2011 |
| CN | 102317534 | 1/2012 |
| CN | 202116878 | 1/2012 |
| CN | 102560960 | 7/2012 |
| CN | 201733135 | 10/2012 |
| CN | 204298638 | 4/2015 |
| CN | 104674521 | 6/2015 |
| DE | 2 261 275 | 5/1974 |
| DE | 202 10 707 | 11/2003 |
| DE | 10-2005-024934 | 12/2006 |
| DE | 102005058898 | 12/2006 |
| DE | 20 2009 005 678 | 6/2009 |
| DE | 10 2009 007 920 | 4/2010 |
| DE | 10 2013 001 682 | 9/2013 |
| DE | 10 2013 208 851 | 11/2014 |
| EP | 1 595 992 | 11/2005 |
| EP | 2 077 349 | 7/2009 |
| EP | 2 161 364 | 3/2010 |
| EP | 2 581 485 | 4/2013 |
| EP | 2 742 843 | 6/2014 |
| EP | 2 837 728 | 2/2015 |
| EP | 2 843 105 | 3/2015 |
| EP | 2 868 795 | 5/2015 |
| EP | 3040467 | 7/2016 |
| GB | 2070130 | 9/1981 |
| GB | 2 118 580 | 11/1983 |
| JP | H 08-84891 | 4/1996 |
| JP | 2006-229319 | 8/2006 |
| JP | 2011-234785 | 11/2011 |
| JP | 2013-188273 | 9/2013 |
| JP | 2014-001984 | 1/2014 |
| KR | 20-1999-0013707 | 4/1999 |
| KR | 20-1999-0029441 | 7/1999 |
| KR | 20-2000-0000962 | 1/2000 |
| KR | 20-0228519 | 9/2001 |
| KR | 20-0245382 | 10/2001 |
| KR | 10-2002-0048576 | 6/2002 |
| KR | 20-0281165 | 7/2002 |
| KR | 10-2003-0011457 | 2/2003 |
| KR | 10-0465690 | 1/2005 |
| KR | 10-2006-0109164 | 10/2006 |
| KR | 10-0662289 | 1/2007 |
| KR | 10-2007-0060063 | 6/2007 |
| KR | 10-0730925 | 6/2007 |
| KR | 10-0741111 | 7/2007 |
| KR | 10-2008-0000442 | 1/2008 |
| KR | 10-0790539 | 1/2008 |
| KR | 10-2008-0058123 | 6/2008 |
| KR | 10-2009-0115005 | 11/2009 |
| KR | 10-2010-0120049 | 11/2010 |
| KR | 10-2011-0012307 | 2/2011 |
| KR | 10-2011-0067886 | 6/2011 |
| KR | 10-2011-0129902 | 12/2011 |
| KR | 10-2011-0130089 | 12/2011 |
| KR | 10-1097306 | 12/2011 |
| KR | 10-2014-0015017 | 2/2014 |
| KR | 10-2014-0016197 | 2/2014 |
| KR | 10-2015-0006262 | 1/2015 |
| KR | 10-2015-0006264 | 1/2015 |
| KR | 10-2015-0061144 | 6/2015 |
| KR | 10-2015-0066140 | 6/2015 |
| KR | 10-2015-0090754 | 8/2015 |
| KR | 10-2015-0120230 | 10/2015 |
| KR | 10-2015-0138903 | 12/2015 |
| WO | WO 2005/075727 | 8/2005 |
| WO | WO 2010/094959 | 8/2010 |
| WO | WO 2010/128729 | 11/2010 |
| WO | WO 2011/014018 | 2/2011 |
| WO | WO 2011/149319 | 12/2011 |
| WO | WO 2014/024393 | 2/2014 |
| WO | WO 2016/078191 | 5/2016 |

OTHER PUBLICATIONS

Korean Office Action dated Mar. 30, 2017 issued in Application No. 10-2016-0040455.
European Search Report dated Mar. 31, 2017 issued in Application No. 16196150.3.
European Search Report dated Apr. 3, 2017 issued in Application No. 16196149.5.
European Search Report dated Apr. 5, 2017 issued in Application No. 16196185.9.
European Search Report dated Apr. 9, 2017 issued in Application No. 16196353.3.
European Search Report dated Apr. 10, 2017 issued in Application No. 16196360.8.
European Search Report dated Apr. 11, 2017 issued in Application No. 16196340.0.

(56) References Cited

OTHER PUBLICATIONS

European Search Report dated Apr. 11, 2017 issued in Application No. 16196351.7.
European Search Report dated Apr. 18, 2017 issued in Application No. EP16196298.0.
Chinese Office Action dated May 3, 2017 issued in Application No. 201610452886.2 (with English Translation).
Chinese Office Action dated May 27, 2017 issued in Application No. 201610457444.7 (with English translation).
Chinese Office Action dated Jun. 26, 2017 issued in Application No. 201610452893.2 (with English translation).
Chinese Office Action dated Aug. 3, 2017 issued in Application No. 201610509856.0 (with English translation).
Korean Office Action dated Sep. 26, 2017 issued in Application No. 10-2016-0040456.
Chinese Office Action dated Sep. 28, 2017 issued in Application No. 201610460998.2 (with English Translation).
Chinese Office Action dated Oct. 10, 2017 issued in Application No. 201610461531.X (with English Translation).
Chinese Office Action dated Oct. 18, 2017 issued in Application No. 201610482128.5 (with English Translation).
U.S. Office Action dated Sep. 28, 2017 issued in U.S. Appl. No. 15/338,874.
U.S. Appl. No. 15/335,852, filed Oct. 27, 2016, Nidhi Vivek Thaker.
U.S. Appl. No. 15/337,206, filed Oct. 28, 2016, Jason Y. Ko.
U.S. Appl. No. 15/337,689, filed Oct. 28, 2016, Jason Y. Ko.
U.S. Appl. No. 15/338,874, filed Oct. 31, 2016, Sahlu Okebato.
U.S. Appl. No. 15/337,586, filed Oct. 28, 2016, Jason Y. Ko.
U.S. Appl. No. 15/340,240, filed Nov. 1, 2016, Rita P. Adklakha.
U.S. Appl. No. 15/339,055, filed Oct. 31, 2016, Andrew Mark Roersma.
U.S. Appl. No. 15/339,265, filed Oct. 31, 2016, Spencer E. Bell.
Machine English Translation of KR 1020150006264 (Year: 2015).
U.S. Office Action dated Nov. 30, 2017 issued in U.S. Appl. No. 15/337,689.
U.S. Office Action dated Dec. 29, 2017 issued in U.S. Appl. No. 15/337,206.
U.S. Office Action dated Feb. 22, 2018 issued in U.S. Appl. No. 15/339,265.
Korean Search Report dated Apr. 15, 2016 issued in Application No. 10-2016-0040447.
Korean Search Report dated Apr. 15, 2016 issued in Application No. 10-2016-0040448.
Korean Search Report dated Apr. 15, 2016 issued in Application No. 10-2016-0040450.
Korean Search Report dated Apr. 15, 2016 issued in Application No. 10-2016-0040453.
Korean Search Report dated Apr. 15, 2016 issued in Application No. 10-2016-0040455.
Korean Search Report dated Apr. 15, 2016 issued in Application No. 10-2016-0040456.
Korean Search Report dated Apr. 15, 2016 issued in Application No. 10-2016-0040457.
Korean Office Action dated Apr. 20, 2016 issued in Application No. 10-2016-0040455.
Korean Office Action dated Apr. 20, 2016 issued in Application No. 10-2016-0040456.
Korean Office Action dated Apr. 20, 2016 issued in Application No. 10-2016-0040457.
Korean Office Action dated May 5, 2016 issued in Application No. 10-2016-0040450.
Korean Office Action dated May 19, 2016 issued in Application No. 10-2016-0040453.
Korean Office Action dated May 31, 2016 issued in Application No. 10-2016-0040448.
Korean Office Action dated Jun. 20, 2016 issued in Application No. 10-2016-0040447.
Korean Office Action dated Jun. 21, 2016 issued in Application No. 10-2016-0040452.
Korean Office Action dated Nov. 15, 2016 issued in Application No. 10-2016-0040455.
Korean Office Action dated Nov. 15, 2016 issued in Application No. 10-2016-0040456.
Korean Office Action dated Nov. 16, 2016 issued in Application No. 10-2016-0040457.
International Search Report dated Jan. 23, 2017 issued Application No. PCT/KR2016/012366.
International Search Report dated Jan. 24, 2017 issued Application No. PCT/KR2016/012365.
International Search Report dated Jan. 25, 2017 issued Application No. PCT/KR2016/012361.
Korean Office Action dated Jun. 21, 2016 issued in Application No. KR 10-2016-0040452 (with English Translation).
Korean Decision of Rejection dated Oct. 31, 2016 issued in Application No. KR 10-2016-0040452 (with English Translation).
Korean Notice of Allowance dated Dec. 26, 2016 issued in Application No. KR 10-2016-0040452 (with English Translation).
KR 2002-0048576 Translated Description, 5 pages (Year: 2002).
CN 201103058Y Translated Description, 11 pages (Year: 2008).
U.S. Notice of Allowance dated Jan. 23, 2018 issued in U.S. Appl. No. 15/338,874.
U.S. Notice of Allowance dated Mar. 2, 2018 issued in U.S. Appl. No. 15/337,689.
U.S. Notice of Allowance dated Mar. 16, 2018 issued in U.S. Appl. No. 15/337,206.
U.S. Office Action dated Mar. 22, 2018 issued in U.S. Appl. No. 15/337,586.
U.S. Office Action dated Apr. 6, 2018 issued in U.S. Appl. No. 15/335,852.
U.S. Office Action dated Apr. 20, 2018 issued in co-pending U.S. Appl. No. 15/339,055.
Korean Office Action dated Apr. 15, 2016 issued in Application No. 10-2016-0040451.
Korean Office Action dated Jun. 21, 2016 issued in Application No. 10-2016-0040451.

\* cited by examiner

LAUNDRY TREATING APPARATUS AND METHOD OF FABRICATING A LAUNDRY TREATING APPARATUS DOOR

CROSS-REFERENCE TO RELATED APPLICATION(S)

Pursuant to 35 U.S.C. § 119(a), this application claims the benefit of the earlier filing date and the right of priority to U.S. Provisional Application No. 62/249,355, filed on Nov. 2, 2015, Korean Application No. 10-2016-0001216, filed on Jan. 5, 2016, and Korean Application No. 10-2016-0040452, filed on Apr. 1, 2016, the contents of which is incorporated by reference herein in its entirety.

BACKGROUND

1. Field

A laundry treating apparatus having a door opening/closing a laundry introduction opening of a main body and a method of fabricating the door of the laundry treating apparatus is disclosed herein.

2. Background

A laundry treating apparatus (or a clothes treating apparatus) may include an apparatus for washing laundry, an apparatus for drying laundry, and an apparatus for washing and drying laundry. In the laundry treating apparatus, washing the laundry may refer to removing contaminants stuck on the laundry through operations of water and detergent, and drying the laundry may refer to removing moisture contained in the laundry through a hot air supply device provided in the laundry treating apparatus.

A general laundry treating apparatus may include a main body defining an outer appearance and having a laundry introduction opening, a laundry accommodating unit or space provided in the main body, a driving unit to rotate a drum which includes the laundry accommodating unit, a door to open and close the laundry introduction opening, and a control unit or controller to output visual information related to strokes processed in the laundry treating apparatus to a user and receiving the user's input.

In the general laundry treating apparatus, the door may open and close the laundry introduction opening and allow the user to see the inner laundry accommodating unit. Also, the control unit is typically installed at the main body, and provided with a plurality of buttons or knobs for briefly outputting only a pre-decided stroke in an On/Off manner and manipulating such brief output. The separate configuration of the door and the control unit may interfere with a simple appearance of the laundry treating apparatus, and input and output interfaces between the laundry treating apparatus and the user may be inconvenient.

Accordingly, studies on providing a control unit on a door and implementing the control unit as a touch screen are undergoing. The related technologies are disclosed in Korean Patent Laid-Open No. 10-2011-0130089 (Published on Dec. 5, 2011) and Korean Patent Laid-Open No. 10-2015-0006264 (Published on Jan. 16, 2015) whose disclosures are hereby incorporated by reference in their entirety. However, the related art including those Patent Publications has not disclosed an alignment between a door cover and a touch sensor and an alignment between the touch sensor and a display module.

In order to configure a touch screen on a door, a touch sensor and a display module may be arranged at a light-transmissive region (transparent region) of a door cover in a corresponding (or aligning) manner. Specifically, when the touch sensor is separately fabricated from the display module and attached to a rear surface of the door cover, the touch sensor should be attached at an accurate position on the door cover in order to ensure reliability of the touch screen.

BRIEF DESCRIPTION OF THE DRAWINGS

Embodiments will be described in detail with reference to the following drawings in which like reference numerals refer to like elements, and wherein.

DETAILED DESCRIPTION

Figure 1:
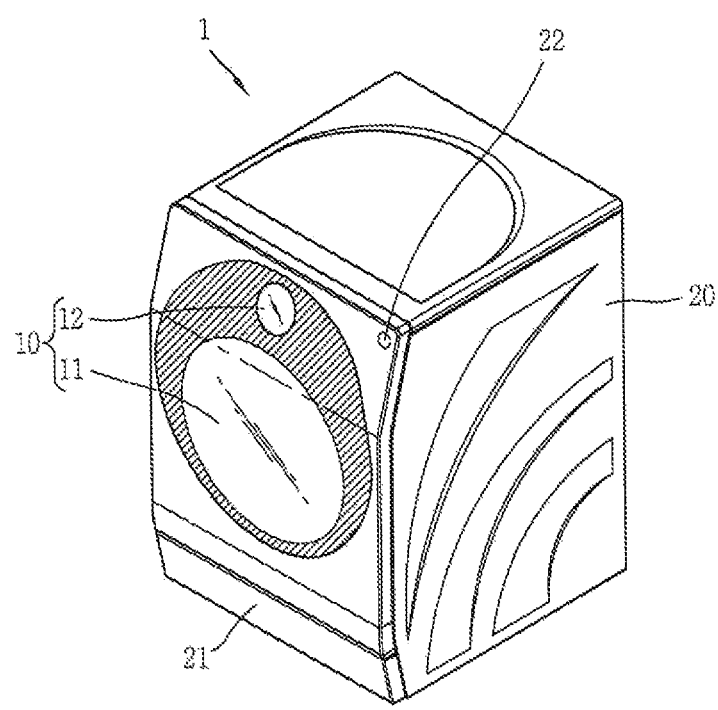
FIG. 1 is a perspective view of a laundry treating apparatus.
Figure 2A:
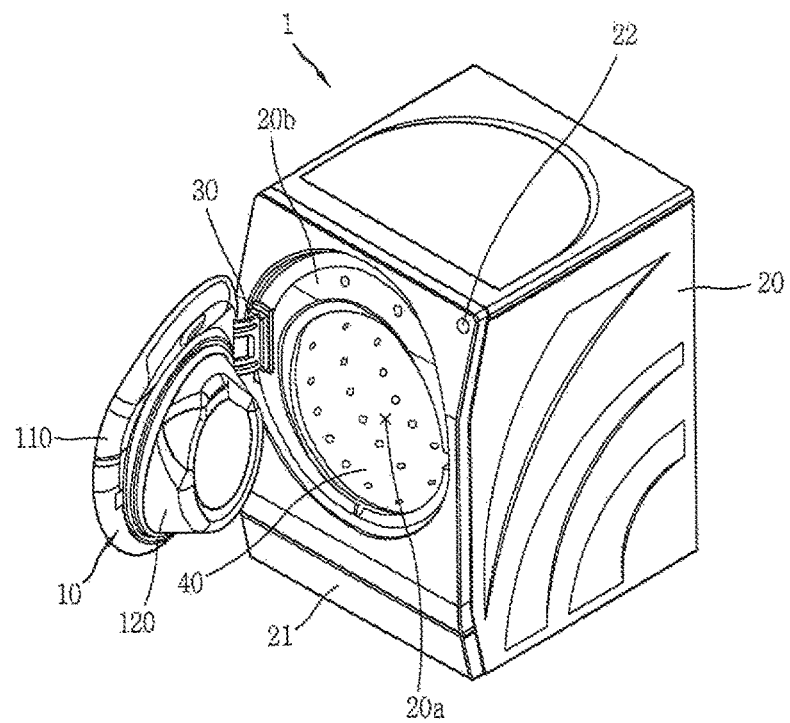
FIG. 2A is a conceptual view illustrating a state that a laundry introduction opening is open, in response to a primary rotation of the door illustrated in FIG. 1.
Figure 2B:
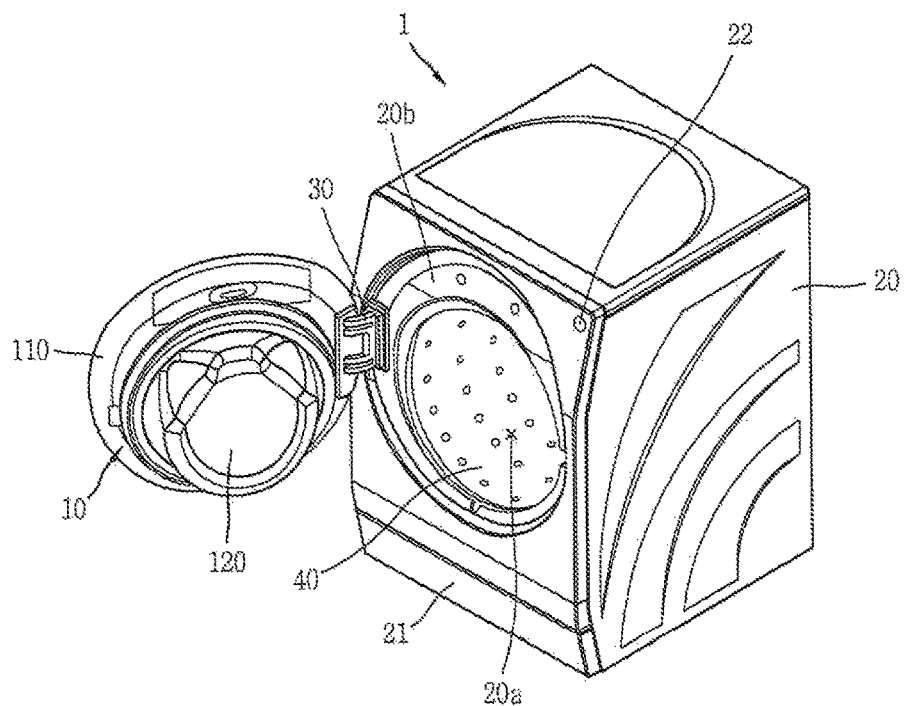
FIG. 2B is a conceptual view illustrating a secondarily-rotated state of the door, from the state illustrated in FIG. 2A.

Referring to FIGS. 1-2B, the laundry treating apparatus 1 may include a main body 20 and a door 10. The main body 20 may define an appearance of the laundry treating apparatus 1, and may have a laundry introduction opening 20a through which laundry is introduced into the main body 20. The laundry introduction opening 20a may be formed at a front portion of the main body 20 in a hexahedral shape.

The main body 20 may have therein a laundry accommodating unit or space in which the laundry is accommodated through the laundry introduction opening 20a. When the laundry treating apparatus 1 is implemented as an apparatus for drying laundry, the laundry accommodating unit may be a drum 40 which is rotatably provided in the main body 20. When the laundry treating apparatus 1 is implemented as an apparatus which can perform both washing and drying of laundry, the laundry accommodating unit may be a tub provided in the main body 20 to store washing water, and a drum 40 rotatably provided in the tub to accommodate the laundry therein.

The main body 20 may have a driving unit that rotates the drum 40. The driving unit may include a motor generating a driving force, and a belt rotating the drum 40 using the driving force.

The main body 20 may have a detergent supply unit that may be pulled out and pushed in like a drawer. A cover 21 covering the detergent supply unit may be rotatable up and down.

The main body 20 may have a power button 22 to turn the laundry treating apparatus 1 on/off. When a display portion 12 to be explained later is configured as a touch screen, the laundry treating apparatus 1 can be turned on/off by applying a touch input to the touch screen 12. In this instance, the power button 22 may not be employed and thus a more simplified appearance of the laundry treating apparatus 1 can be implemented.

The door 10 may be relatively movable with respect to the main body 20 to open and close the laundry introduction opening 20a. As illustrated, the door 10 may be installed to be rotatable with respect to the main body 20 centering on a hinge unit (or hinge) 30.

The main body 20 may have a door accommodating portion 20b recessed into an outer surface of the main body 20 and having the laundry introduction opening 20a therein. When the door 10 is closed, the door 10 may be accommodated in the door accommodating portion 20b, and an edge of an outer surface of the door 10 may be flush with an adjacent outer surface of the main body 20.

When the door 10 is accommodated in the door accommodating portion 20b, in order to prevent the door 10 from being stopped at the main body 20, the hinge unit 30 may have a dual-hinge structure having two different rotation shafts. In this instance, as illustrated in FIGS. 2A and 2B, the door 10 may be spaced apart from the door accommodating portion 20b by a primary rotation centering on one of the two rotation shafts, and thereafter rotated by a secondary rotation centering on the other rotation shaft.

When hinge unit 30 is mounted to a first side of the door 10, a locking device to lock or unlock the door 10 with respect to the main body 20 may be provided on a second side of the door 10. The locking device may be configured in a pressing manner. Accordingly, the door 10 may be locked when the second side of the door 10 is pressed once, and unlocked when pressed once again.

The door 10 may have a window portion 11 and a display portion 12. In a closed state of the door 10, the window portion 11 may face the laundry introduction opening 20a, such that the inside of the laundry accommodating unit is visible therethrough. The window portion 11 may thus allow a user to check a state of the laundry accommodated in the laundry accommodating unit through the window portion 11.

The display portion 12 may output information processed in the laundry treating apparatus 1. For example, the display portion 12 may output execution screen information regarding strokes (washing, dehydrating, drying, etc.) performed in the laundry treating apparatus 1, or user interface (UI) or graphic user interface (GUI) information corresponding to the execution screen information.

Figure 3:
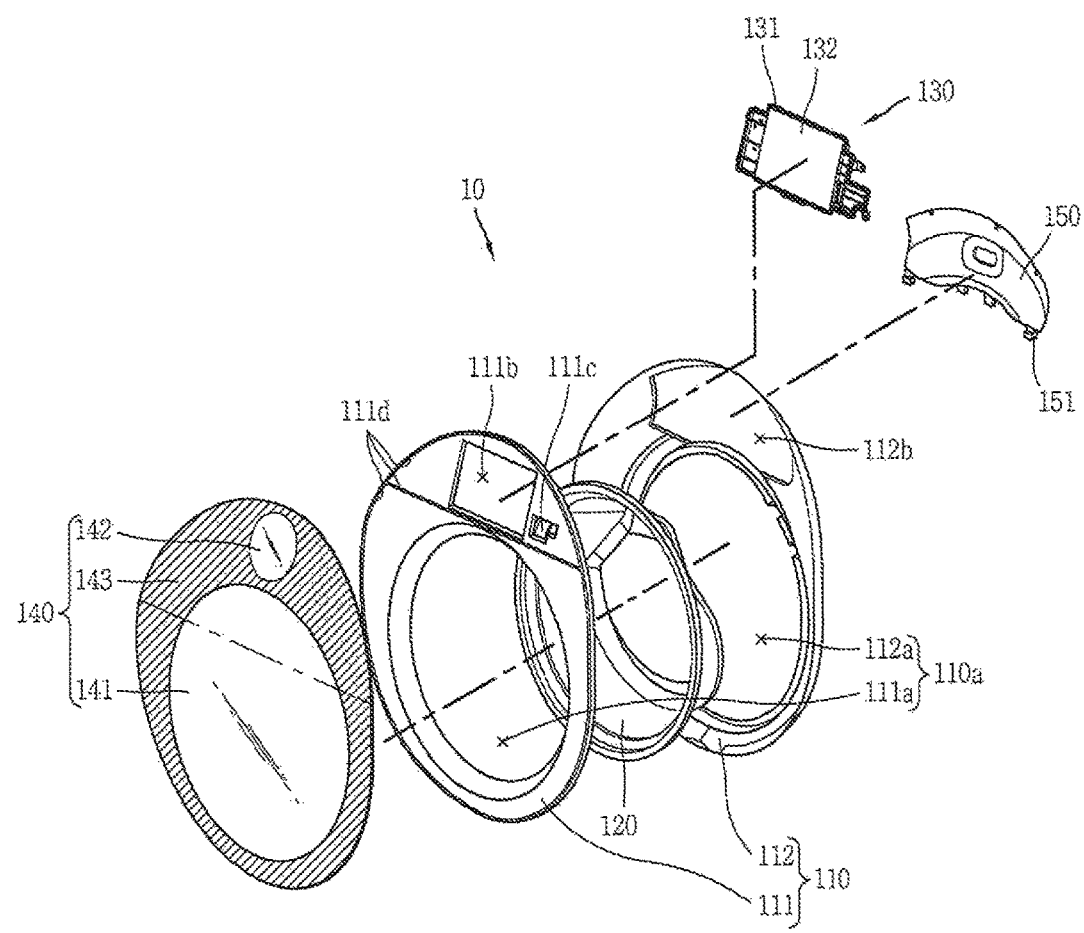
FIG. 3 is a disassembled perspective view of the door illustrated in FIG. 1.
Figure 4:
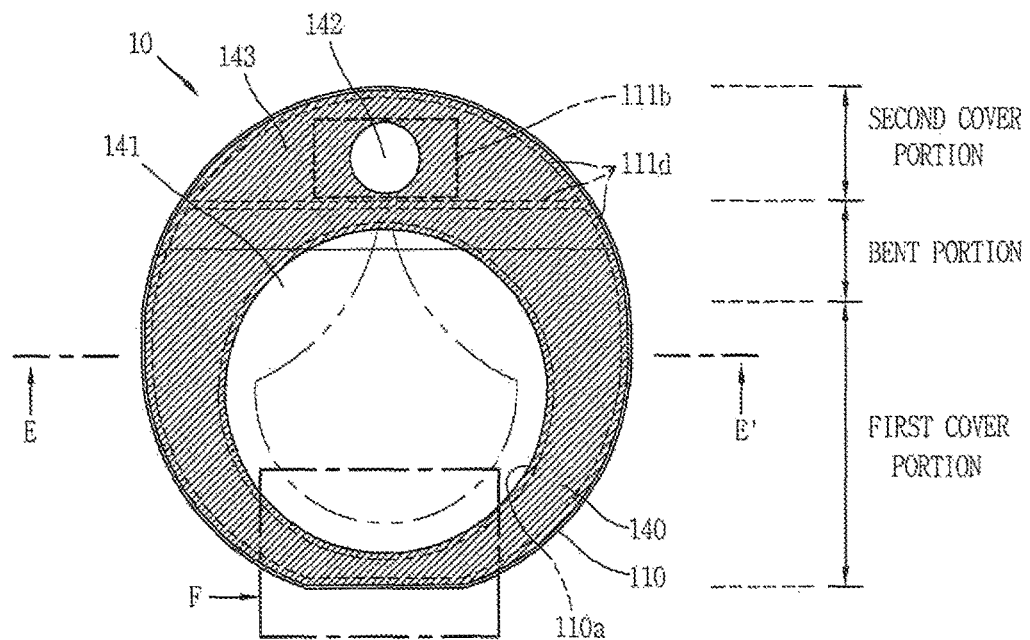
FIG. 4 is a front view of the door illustrated in FIG. 1.

As illustrated in FIGS. 3 and 4, the door 10 may include a door frame 110, a door window 120, a display module 130 and a door cover 140. As aforementioned, the door 10 may have the hinge unit 30 to couple with the main body 20, but the hinge unit 30 is omitted in this drawings.

The door 10 may be formed in a circular shape (including a perfectly circular shape, an oval shape, or a circular shape with at least part rounded). The door 10 may also be formed in a polygonal shape (a rectangular shape, a hexagonal shape, etc.).

The door frame 110 may be rotatably coupled to the main body 20, and to this end, the hinge unit 30 may be coupled to the door frame 110 and the main body 20, respectively. The door frame 110 may include an outer frame 111 and an inner frame 112. The outer frame 111 and the inner frame 112 may be made of a synthetic resin material (e.g., ABS, PC, etc.).

For reference, those components are referred to as the outer frame 111 and the inner frame 112 because the outer frame 111 faces the outside of the main body 20 and the inner frame 112 faces the inside of the main body when viewing only the door frame 110 in the closed state of the door 10. Alternatively, the outer frame 111 and the inner frame 112 may also be referred to as first and second frames, respectively, without such distinguishment.

The door frame 110 may include a first opening portion 110a facing the laundry introduction opening 20a, and a second opening portion 111b corresponding to the display module 130 mounted inside, in the closed state of the door 10. The first opening portion 110a may also be referred to as a window hole in the aspect that the door window 120 is positioned at the first opening portion 110a, and the second opening portion 111b may also be referred to as a display hole in the aspect that the display module 130 is positioned at the second opening portion 111b. The second opening portion 111b may be located above the first opening portion 110a.

The first opening portion 110a may include a front opening 111a formed through the outer frame 111, and a rear opening 112a formed through the inner frame 112. The second opening portion 111b may be formed through the outer frame 111. A communicating portion 112b may be formed above the rear opening 112a of the inner frame 112. The display module 130 may be mounted in the door frame 110 through the communicating portion 112b.

The door window 120 may be installed at the door frame 110 to correspond to the first opening portion 110a. The door window 120 may be made of a transparent material (glass, synthetic resin materials, etc.) and may to face the laundry introduction opening 20a in the closed state of the door 10.

The display module 130 may be provided in the door frame 110. The display module 130 may include a mounting frame 131 and a display 132. The display module 130 may correspond to (aligned with) the second opening portion 111b, and the display 132 provided on the mounting frame 131 may output visual information related to information processed in the laundry treating apparatus 1.

Figure 5:
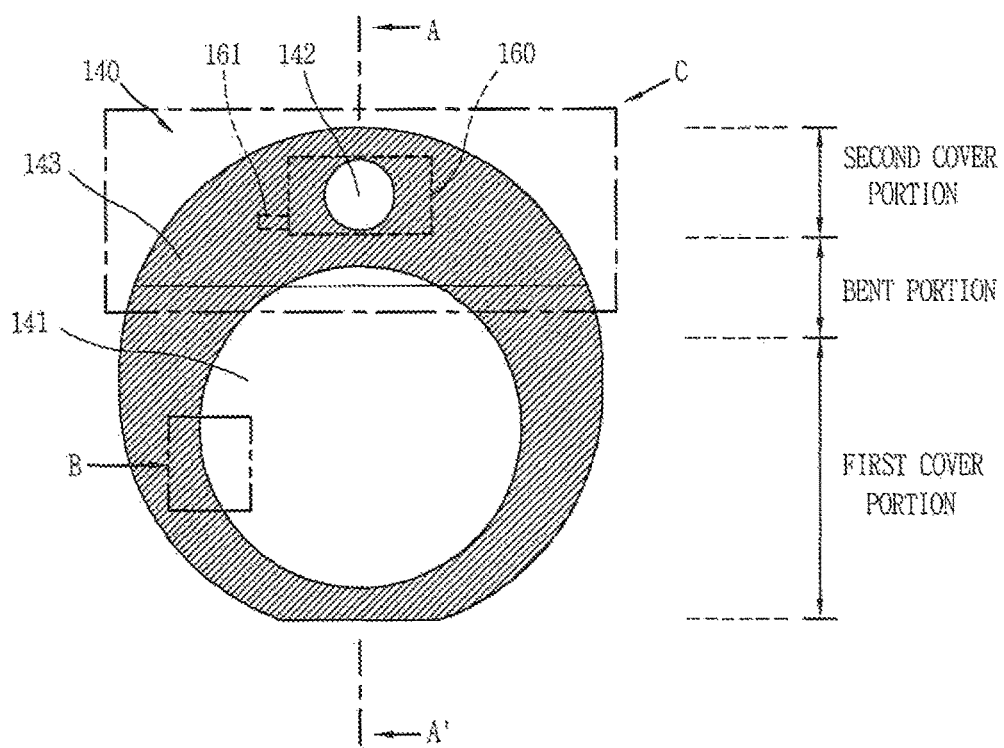
FIG. 5 is a rear view of a door cover illustrated in FIG. 3.

In addition, a flexible printed circuit board (FPCB) hole 111c through which a FPCB 161 (see FIG. 5) of a touch sensor 160 is inserted may be formed at the door frame 110. The FPCB hole 111c may be located at one side of the second opening portion 111b. The door cover 140 which defines an appearance of the door 10 may be coupled to the door frame 110. The door cover 140 may be made of a glass material or a synthetic resin material having transmittance (or transparency).

The door cover 140 may include an opaque region 143, and a first transparent region 141 corresponding to the first opening portion 110a and a second transparent region 142 corresponding to the second opening portion 111b within the opaque region 143. Here, a transparent region (or light transmitting region) refers to a region through which at least some light is transmitted such that an opposite side or inside is visible. Therefore, the transparent region may be understood as a conception including a semitransparent region.

The first and second transparent regions 141 and 142 may be divided by the opaque region 143. The door frame 110 and the door cover 140 may be formed in a circular shape to correspond to the circular door 10, and the first and second transparent regions 141 and 142 may be formed in a circular shape to make the user feel unity from the integrated shape. The circular shape may include a circle, an oval, or a circular shape with at least part rounded.

For reference, the formation of those components into the circular shape is merely illustrative, and the present disclosure may not be limited to this. For example, the first and second transparent regions 141 and 142 may be formed in a polygonal shape (e.g., rectangle, hexagon, etc.) and other geometric shapes, in addition to the circular shape.

The door cover 140 may have at least a part formed in a bent shape. For example, based on the bent portion of the door cover 140, first and second cover portions at both sides of the bent portion may be inclined toward each other. Here, the first cover portion and the second cover portion may be formed in a flat shape. To correspond to the shape of the door cover 140, the door frame 110 may also have at least part formed in a bent shape. The first transparent region 141 may be formed over the first cover portion and the bent portion, and the second transparent region 142 may be formed at the second cover portion.

Meanwhile, the second transparent region 142 may be smaller than the second opening portion 111b in size, and provided within the second opening portion 111b in an overlapping manner when the door cover 140 is coupled to the door frame 110. Here, the overlapping refers to overlapping in a thickness direction of the door 10. According to such arrangement, an outer line forming the second opening 111b may not be visible due to the opaque region 143.

The display module 130 may be provided in the second opening 111b. The second transparent region 142 may be provided within the display 132, which is provided on the display module 130, in an overlapping manner. According to the arrangement, by exposing only the display 132, other device structures (e.g., the mounting frame 131) may not be exposed by virtue of the opaque region 143, which may result in implementing a more simplified appearance of the door 10.

In addition, an edge region (i.e., bezel region) of the display 132 may correspond to a substantially non-output region of visual information due to a limitation of design. If the edge region is arranged within the second transparent region 142, the visual information output on the display 132 may be output on a smaller screen than the second transparent region 142. In this instance, the user may feel like the output screen of the visual information is smaller than an actual size.

To solve this problem, the edge region of the display 132, on which any visual information is not output, may be covered with the opaque region 143. According to the arrangement, the visual information output on the display 132 may construct a screen which completely corresponds to (is fully fit to) the second transparent region 142. In this instance, the user may feel like the output screen of the visual information is greater than an actual size, and accordingly can be more immersed in the screen.

The second opening portion 111b may have a rectangular shape corresponding to the rectangular display module 130, and the second transparent region 142 may have a circular shape arranged in the second opening portion 111b in an overlapping manner. The second transparent region 142 may overlap a part of the display module 130, and the opaque region 143 may obscure another part of the display module 130. Thus, visual information may be output only through a portion of the display module 130 corresponding to the second transparent region 142, thereby providing the user with the display portion 12 in the circular shape.

The circular display may be more expensive than a rectangular display which is generally widely used, and also difficult to set an accurate installation position in view of its shape, which may frequently cause a defective assembly. However, the rectangular display 132 which requires for less fabricating costs and may be assembled at an accurate position may be used and also the display portion 12 which looks circular may be provided to the user.

The second transparent region 142 may be surrounded by the opaque region 143, and accordingly visual information which is output on a portion of the display 132 which does not correspond to the second transparent region 142 may be invisible to the user. Considering this, the visible information may not be output on the portion of the display 132 which does not correspond to the second transparent region 142.

For example, while visual information related to information processed in the laundry treating apparatus 1 is output on a portion of the display 132 corresponding to the second transparent region 142, an outer image surrounding the visual information may be output on the portion of the display 132 without corresponding to the second transparent region 142. The outer image may be on a portion of the display 132 which does not correspond to the second transparent region 142, and may be filled with a specific color tone (e.g., black).

When the visual information processed in the laundry treating apparatus 1 is output on the portion of the display 132 corresponding to the second transparent region 142, the portion of the display 132 that does not correspond to the second transparent region 142 may be turned off. The portion of the display 132 that does not correspond to the second transparent region 142 may not output any outer image or visual information. Thus, only the part of the display 132 may be turned on, and the display 132 may be more efficiently driven than the foregoing embodiment of turning on the entire display 132, resulting in a power saving effect.

The display portion (or touchscreen) 12 provided on the door cover 140 may be interlayered or integrated with the touch sensor 160, thereby implementing the touch screen 12. The touch screen 12 may function as a user input which provides an input interface between the laundry treating apparatus 1 and the user and simultaneously provides an output interface between the laundry treating apparatus 1 and the user. For example, selection and change of an operation mode among washing, dehydrating, and drying strokes may be realized by applying a user's touch input (or touch) to the display portion 12.

The touch sensor 160 may be provided on the door 10 to sense a touch sensor applied to the door cover 140. The touch sensor 160 may sense a touch input, which is applied to the display portion (or touch screen) 12 in at least one of various touch manners, such as a resistive manner, a capacitive manner, an infrared manner, an ultrasonic type, a magnetic manner, and the like.

The touch sensor 160 may convert a change of pressure applied to a specific portion of the touch screen 12 or capacitance generated at the specific portion into an electrical input signal. The touch sensor 160 may detect touch position, touch area, touch pressure and the like, which are made by a touch object applying a touch to the touch screen. Here, the touch object may be an object applying a touch onto the touch sensor 160, for example, a finger, a touch pen, a stylus pen, a pointer, or the like.

In this manner, when a touch input is applied to the touch sensor 160, the touch sensor 160 may send a corresponding signal to a control unit (or controller). The control unit may then transmit which area of the display portion 12 has been touched. Here, the control unit may be a separate component from the controller or the controller itself.

The controller may perform different controls or the same control according to a type of a touch object applying a touch to the touch screen 12. Whether to perform a different control or the same control according to the type of the touch object may be decided according to an operating state of the laundry treating apparatus 1 or a currently-executed application program.

The touch sensor 160 may sense various types of touches applied to the touch screen 12. Examples of the various types of touches may include a short (or tap) touch, a long touch, a multi touch, a drag touch, a flick touch, a pinch-in touch, a pinch-out touch, a swipe touch, a hovering touch, and the like. The touch sensor 160 may sense a touch input applied to a sensing region including the second transparent region 142.

The touch sensor 160 may be attached to a rear surface of the door cover 140 to cover the second transparent region 142 and a part of the opaque region 143 surrounding the second transparent region 142. With the configuration, the sensing region of the touch sensor 160 may also include even the part of the opaque region surrounding the second transparent region 142 as well as the second transparent region 142. Therefore, various UIs or GUIs using the part of the opaque region 143 surrounding the second transparent region 142 may be provided.

In the structure, the touch sensor 160 may be formed in a shape of a touch film providing a touch pattern, and may be provided between the door cover 140 and the display module 130. The touch film may be made of a transparent conductive film, and indium-tin oxide (ITO) film, carbon nano tube (CNT) film, and the like can be used as the touch film.

The touch film may be configured into one layer or two layers. For example, when the touch film forms two layers (glass-film-film (GFF)), the touch film may be attached to the rear surface of the door cover 140 or on the display module 130. As another example, when the touch film forms one layer, the touch film may be attached to the rear surface of the door cover 140 in an integral form.

The touch sensor 160 may also be configured in a manner of patterning a metal wire directly onto the rear surface of the door cover 140 without a separate touch film [G2: Glass only]. The touch sensor 160 may also be integrally formed with the display 132 provided on the display module 130. For example, the touch sensor 160 may be provided on a substrate of the display 132 (on-cell) or within the display 132 (in-cell).

Meanwhile, the display portion 12 of the laundry treating apparatus 1 may be driven under the control of the controller. The controller may control On/Off of the display module 130, an output of visual information or image, and On/Off of the touch sensor 160.

The controller may control whether or not to activate sensing of a touch applied to a portion of the sensing region of the touch sensor 160 which does not correspond to the second transparent region 142. For example, by determining whether or not it is necessary to sense a touch applied to the portion of the sensing region of the touch sensor 160 that does not correspond to the second transparent region 142, the touch sensing with respect to the non-corresponding portion may be deactivated. According to the control, an error which is likely to occur when the user applies a touch input may be reduced and a power-saving effect may be obtained.

Figure 6:
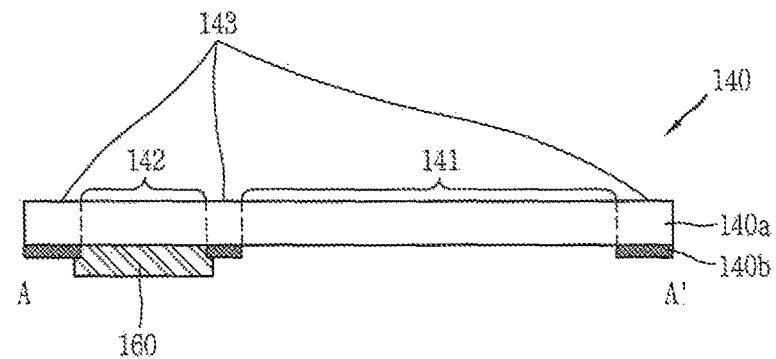
FIG. 6 is a sectional view illustrating a first exemplary embodiment of a door cover, taken along the line A-A' illustrated in FIG. 5.

Referring to FIG. 6, the door cover 140 may include a cover body 140a and a shielding layer 140b. The cover body 140a may be made of a transparent material. The cover body 140a may also be made of a transparent glass material or a synthetic resin material. At least part of the cover body 140a may be formed in a bent shape.

The shielding layer 140b may shield one surface of the cover body 140a to form the opaque region 143. The shielding layer 140b may be formed on a front or rear surface of the cover body 140a.

The shielding layer 140b may be formed by printing ink onto the rear surface of the cover body 140a. The ink may contain a pigment with a specific color tone (e.g., black, white, blue, etc.). The shielding layer 140b may alternatively be formed by various printing methods, such as screen printing (using a mesh made of silk, nylon, tetron, stainless steel, etc.), offset printing, transfer printing, and the like.

The shielding layer 140b may not be provided on the first and second transparent regions 141 and 142. In other words, the first and second transparent regions 141 and 142 may be transparent portions on which the transparent cover body 140a is left without being shielded by the shielding layer 140b.

The shielding layer 140b may surround the first and second transparent regions 141 and 142. The first and second transparent regions 141 and 142 may be divided by the opaque region 143 which may be formed by the shielding layer 140b.

The touch sensor 160 may be attached to the rear surface of the cover body 140a corresponding to the second transparent region 142. The touch sensor 160 may completely cover the second transparent region 142 to detect a touch input applied to the second transparent region 142. The touch sensor 160 may be larger than the second transparent region 142. In this instance, the touch sensor 160 cover a part of the shielding layer 140b defining the second transparent region 142. The transparent touch sensor 160 and the transparent cover body 140a may be sequentially arranged at the front side of the display 132 provided on the display module 130.

Figure 7:
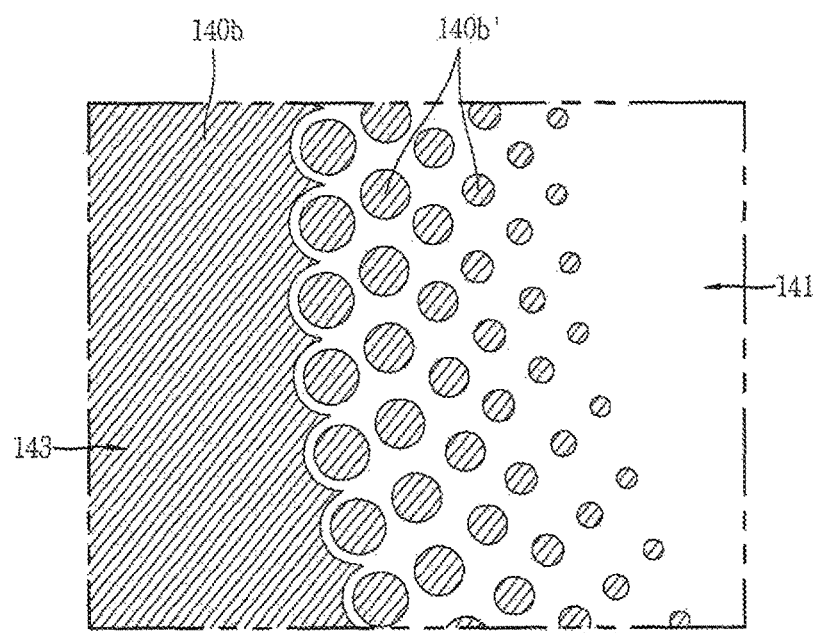
FIG. 7 is an enlarged view of a part B illustrated in FIG. 5.

As illustrated in FIG. 7, the shielding layer 140b which defines the first transparent region 141 of the door cover 140 may be configured such that transparency thereof gradually changes toward the first transparent region 141.

For example, the opaque region 143 around the first transparent region 141 may gradually become more transparent toward the first transparent region 141. To this end, the shielding layer 140*b* may include a plurality of shielding dots 140*b*' which are formed around the first transparent region 141. The plurality of shielding dots 140*b*' may be configured to have a density which gradually lowers toward the first transparent region 141.

By blurring a boundary of the first transparent region 141 by such halftone technique, the region from the opaque region 143 up to the first transparent region 141 may be naturally viewed. On the other hand, the second transparent region 142 and the opaque region 143 surrounding it may obviously be divided by the opaque region 143 in a form of a boundary.

Figure 8:
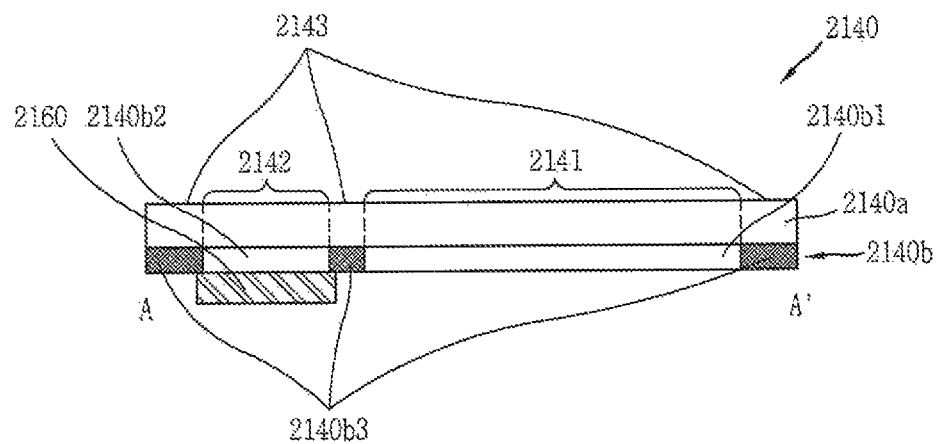
FIG. 8 is a sectional view illustrating a second exemplary embodiment of a door cover, taken along the line A-A' illustrated in FIG. 5.

As illustrated in FIG. 8, the film 2140*b* may include an opaque portion 2140*b*3 corresponding to the opaque region 2143, a first transparent portion 2140*b*1 corresponding to a first transparent region 2141, and a second transparent portion 2140*b*2 corresponding to a second transparent region 2142. The opaque portion 2140*b*3 may surround the first and second transparent portions 2140*b*1 and 2140*b*2. The first and second transparent portions 2140*b*1 and 2140*b*2 may be divided from each other by the opaque portion 2140*b*3.

A portion corresponding to the opaque portion 2140*b*3 may function as a shielding layer, which makes a door cover 2140 opaque, and form the opaque region 2143. Portions corresponding to the first and second transparent portions 2140*b*1 and 2140*b*2 may form the first and second transparent regions 2141 and 2142, respectively, along with the transparent cover body 2140*a*. The first and second transparent regions 2141 and 2142 may be formed by arranging transparent portions of the film 2140*b*, namely, the first and second transparent portions 2140*b*1 and 2140*b*2, on the transparent cover body 2140*a*.

A touch sensor 2160 may be attached to a rear surface of the film 2140*b* corresponding to the second transparent portion 2140*b*2. The touch sensor 2160 may completely cover the second transparent region 2142 to detect a touch input applied to the second transparent region 2142. The touch sensor 2160 may be larger than the second transparent region 2142. In this instance, the touch sensor 2160 may cover a part of the opaque portion 2140*b*3 surrounding the second transparent portion 2140*b*2. The transparent touch sensor 2160, the second transparent portion 2140*b*2 of the film 2140*b*, and the transparent cover body 140*a* may be sequentially arranged at the front side of the display 132 provided on the display module 130.

Figure 9:
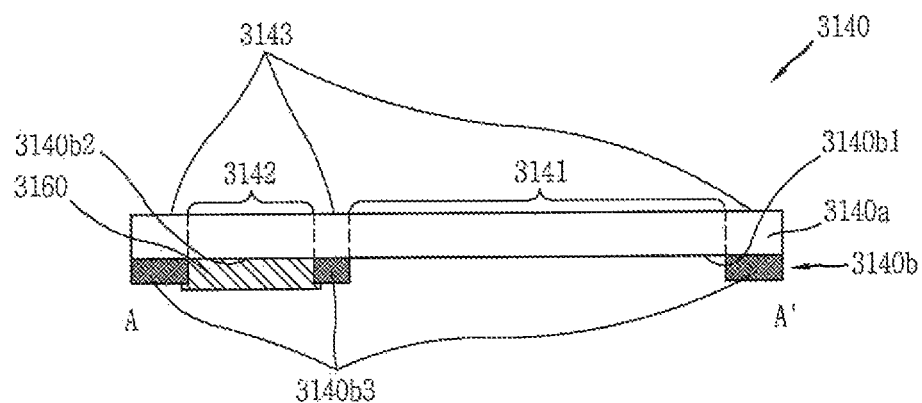
FIG. 9 is a sectional view illustrating a third exemplary embodiment of a door cover, taken along the line A-A' illustrated in FIG. 5.

A film 3140*b* that forms a shielding layer 3140*b* may be attached to a rear surface of a cover body 3140*a*. As illustrated in FIG. 9, the film 3140*b* may include an opaque portion 3140*b*3 corresponding to an opaque region 3143, a first hole 3140*b*1 corresponding to a first transparent region 3141, and a second hole 3140*b*2 corresponding to a second transparent region 3142. The opaque portion 3140*b*3 may surround the first and second holes 3140*b*1 and 3140*b*2, and the first and second holes 3140*b*1 and 3140*b*2 may be divided by the opaque portion 3140*b*3.

Here, a portion of the film 3140*b* corresponding to the opaque portion 3140*b*3 may function as a shielding layer which makes the door cover 3140 opaque, and form the opaque region 3143. The first and second holes 3140*b*1 and 3140*b*2 may be formed at portions corresponding to the first and second transparent regions 3141 and 3142. Accordingly, the first and second holes 3140*b*1 and 3140*b*2 may expose the transparent cover body 3140*a* through the film 3140*b*.

A touch sensor 3160 may be attached to a rear surface of the cover body 3140*a* corresponding to the second transparent region 3142. The touch sensor 3160 may completely cover the second transparent region 3142 to detect a touch input applied to the second transparent region 3142. The touch sensor 3160 may be larger than the second transparent region 3142. In this instance, the touch sensor 3160 may cover a part of the opaque portion 3140*b*3 surrounding the second hole 3140*b*2.

The transparent touch sensor 3160 and the transparent cover body 3140*a* may be sequentially arranged at the front side of the display 132 provided on the display module 130. This may be substantially the same as the layered structure illustrated in FIG. 6, with a slight difference of the thickness between the shielding layers 140*b* and 3140*b*.

The touch sensor 160, 3160 may be attached directly onto the transparent cover body 140*a*, 3140*a*, which may increase touch sensitivity that the user feels. Also, unlike the layered structure illustrated in FIG. 8, the second transparent portion 2140*b*2 of the film 2140*b* may not be provided at the front of the display 132, which may allow visual information output on the display 132 to be more clearly provided.

The method of attaching the film 2140*b*, 3140*b* onto the door cover 2140, 3140 illustrated in FIGS. 8 and 9 may be an in-mold injection, a transfer method, and the like. The in-mold injection may be used when the door cover 2140, 3140 is made of synthetic resin, and may be a method in which the film 2140*b*, 3140*b* is provided in a mold and integrally formed with the door cover 2140, 3140. The transfer method may be a method of attaching the film 2140*b*, 3140*b* onto the door cover 2140, 3140 made of glass or synthetic resin through heat transfer pressing.

In order to implement the touch screen 12 on the door 10, the touch sensor 160 and the display module 130 may be aligned with the second transparent region 142 of the door cover 140. When the touch sensor 160 is not provided on the display module 130 but configured separate from the display module 130 to be attached to the rear surface of the door cover 140, the touch sensor 160 may be attached to an accurate position of the door cover 140 to ensure reliability of the touch screen 12.

Therefore, it may be important to align the touch sensor 160 with the second transparent region 142 and the display module 130. Among others, during an assembly process, the touch sensor 160 should be attached to a preset position of the door cover 140 to ensure an alignment with the display module 130 which is to be assembled therewith later.

Figure 10:
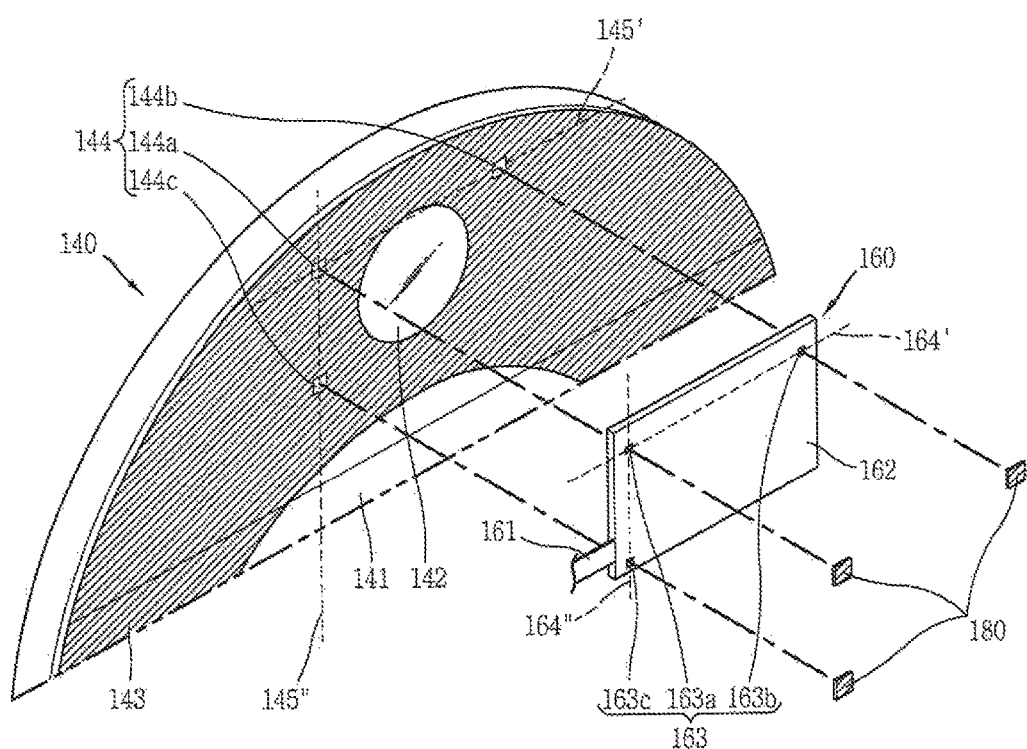
FIG. 10 is a conceptual view illustrating a door cover and a touch sensor in a separated state at a part C illustrated in FIG. 5.
Figure 11:
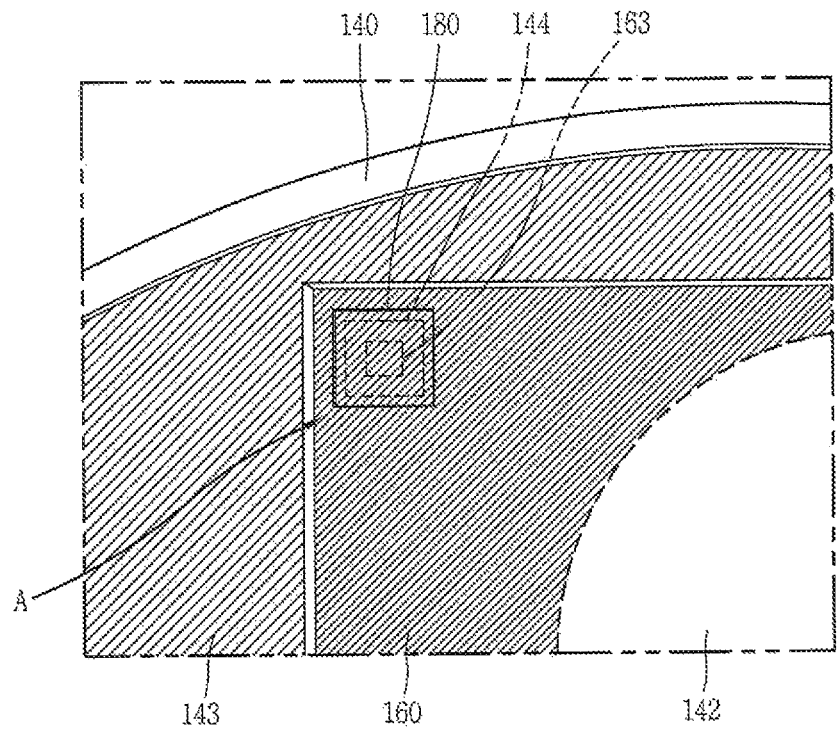
FIG. 11 is an enlarged view of the part C illustrated in FIG. 5.

As illustrated in FIGS. 10 and 11, an align mark 163 may be formed on the touch sensor 160, and a guide mark 144 to guide an attachment position of the touch sensor 160 using the align mark 163 may be formed on the door cover 140. The align mark 163 and the guide mark 144 may help in setting the attachment position of the touch sensor 160 with respect to the door cover 140.

The touch sensor 160 may be circular (perfect circle, oval, etc.) as well as polygonal (rectangle, hexagon, etc.). However, considering that the touch sensor 160 implements the display portion 12 as the touch screen, the touch sensor 160 may preferably be formed in a shape corresponding to the display module 130. FIGS. 10 and 11 exemplarily illustrate that the touch sensor 160 may have a rectangular shape corresponding to the rectangular display module 130.

The touch sensor 160 may be larger than the second transparent region 142 to cover the second transparent region 142 formed on the door cover 140. Therefore, a first part of the touch sensor 160 may cover the second transparent region 142 and a second part of the touch screen 160 may cover the opaque region 143 around the second transparent region 142. On the second part of the touch sensor 160 which covers the opaque region 143 may be formed the align mark 163 which is an attachment reference point of the touch sensor 160 with respect to the door cover 140.

The align mark 163 may include a plurality of align marks 163, and may be provided on at least three points of the touch sensor 160 in a spaced manner. When the align mark 163 includes a first align mark 163*a*, a second align mark 163*b* and a third align mark 163*c*, a first virtual align line 164' connecting the first align mark 163*a* and the second align mark 163*b* may intersect with a second virtual align line 164" connecting the first align mark 163*a* and the third align mark 163*c*.

The align mark 163 may be formed at a corner portion of the touch sensor 160 which does not correspond to the second transparent region 142. The first to third align marks 163*a*, 163*b* and 163*c* may be located on each corner portion of the touch sensor 160 and the first and second virtual align lines 164' and 164" may be arranged perpendicular to each other.

The guide mark 144 may be formed on the opaque region 143 of the door cover 140, and include a transparent portion 144' (see FIG. 12) to be visually distinguishable within the opaque region 143. The guide mark 144 may include a plurality of guide marks 144, arranged on a plurality of points around the second transparent region 142.

The guide mark 144 may correspond to the align mark 163. The guide mark 144 may include a plurality of guide marks 144, arranged on at least three points of the door cover 140 in a spaced manner. When the guide mark 144 includes a first guide mark 144*a*, a second guide mark 144*b* and a third guide mark 144*c*, a first virtual guide line 145' connecting the first guide mark 144*a* and the second guide mark 144*b* may intersect with a second virtual guide line 145" connecting the first guide mark 144*a* and the second guide mark 144*c*. Thus, the touch sensor 160 may be more accurately aligned with the door cover 140, and also may be more accurately aligned with the display module 130 which is to be assembled later, thereby ensuring reliability of the touch screen 12.

The guide mark 144 may be formed on the opaque region 143 surrounding the second transparent region 142. The first to third guide marks 144*a*, 144*b* and 144*c* may be located on the opaque region 143 around the second transparent region 142, and the first virtual guide line 145' and the second virtual guide line 145" may be arranged perpendicular to each other.

When the first to third align marks 163*a*, 163*b* and 163*c* correspond to the first to third guide marks 144*a*, 144*b* and 144*c*, respectively, the touch sensor 160 may be in an aligned state with the door cover 140. When the touch sensor 160 is attached to the rear surface of the door cover 140, the align mark 163 may be arranged in the guide mark 144 in an overlapping manner.

Meanwhile, since the guide mark 144 has the transparent portion 144' to be visually distinguished within the opaque region 143, at least part of the transparent portion 144' may not be obscured even though the touch sensor 160 is attached to the door cover 140, which may allow the user to visually distinguish at least part of the transparent portion 144'. This, however, may interfere with implementing a simple appearance of the door.

When the front surface of the touch sensor 160 is attached to the rear surface of the door cover 140, a shielding member 180 which is opaque (non-transparent) may be attached to the rear surface of the touch sensor 160 to cover the guide mark 144. The shielding member 180 may preferably have the same color tone as the color of the opaque region 143. The shielding member 180 may have a shape of a film or a thin pad. The shielding member 180 may obscure the transparent portion 144' of the guide mark 144, which may make it difficult for the user to identify the guide mark 144.

Figure 12:
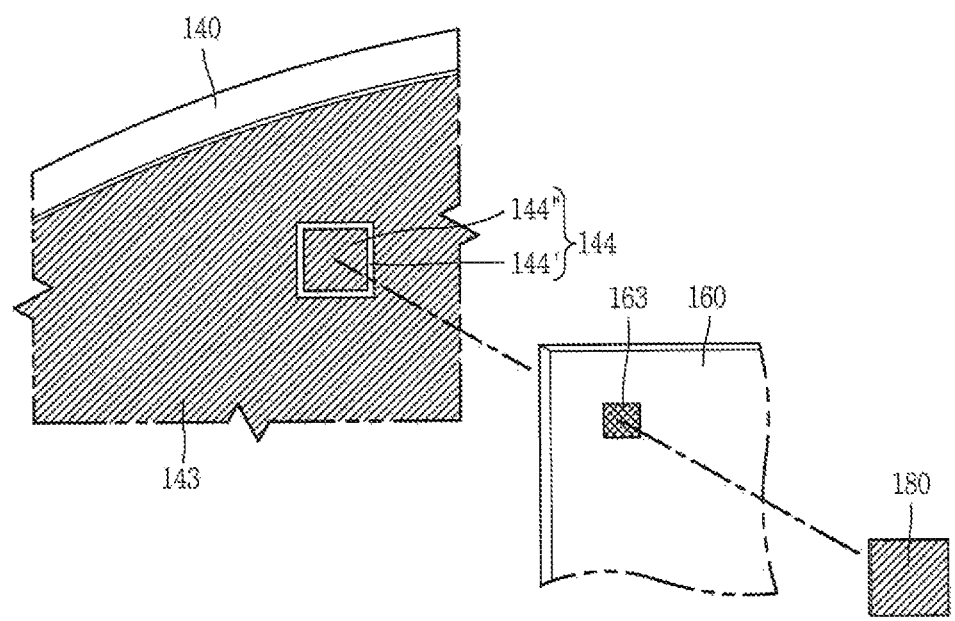
FIG. 12 is a conceptual view illustrating a first exemplary embodiment of a structure to align a door cover with a touch sensor illustrated in FIG. 11.

Referring to FIG. 12, the guide mark 144 may include a transparent portion 144' and an opaque portion 144" within the transparent portion 144'. The transparent portion 144' may surround the opaque portion 144" to divide the opaque portion 144" and the opaque region 143. The transparent portion 144' may be formed within the opaque region 143 and the opaque region 144" may be formed within the transparent portion 144'.

The transparent portion 144' may be formed as a closed loop completely surrounding the opaque portion 144". However, the transparent portion 144" may also be formed in a shape of an open loop surrounding a part of the opaque portion 144".

The opaque portion 144" may be formed of the same material as the opaque region 143. Also, the opaque portion 144" and the opaque region 143 may have the same color tone (e.g., black).

The transparent portion 144' may be excluded upon forming the opaque region 143. For example, the transparent portion 144' may be excluded upon printing an opaque material to form the opaque region 143 on the rear surface of the door cover 140 [see the description related to the shielding layer 140*b* (FIG. 6)], namely, a portion on which only the transparent cover body 140*a* is left.

When the guide mark 144 includes the transparent portion 144' and the opaque portion 144" within the transparent portion 144', the user may not easily identify the guide mark 144 by virtue of the formation of the opaque portion 144" within the transparent portion 144' even though the guide mark 144 is recognized as a separate component within the opaque region 143 due to the transparent portion 144'. When the align mark 163 is arranged within the opaque portion 144", the touch sensor 160 may be aligned with the door cover 140. When the front surface of the touch sensor 160 is attached to the rear surface of the door cover 140, the align mark 163 may be arranged within the opaque portion 144" in an overlapping manner.

The align mark 163 may have a different color tone from the opaque portion 144". Accordingly, the align mark 163 overlapped within the opaque portion 144" may be easily recognized, which may result in improved convenience in the assembly process.

When the touch sensor 160 has been attached to the door cover 140, the opaque shielding member 180 may be attached to the rear surface of the touch sensor 160 to cover the transparent portion 144' of the guide mark 144. The shielding member 180 may cover both of the transparent portion 144' and the opaque portion 144" or may be formed in a loop shape corresponding to the transparent portion 144'.

Figure 13:
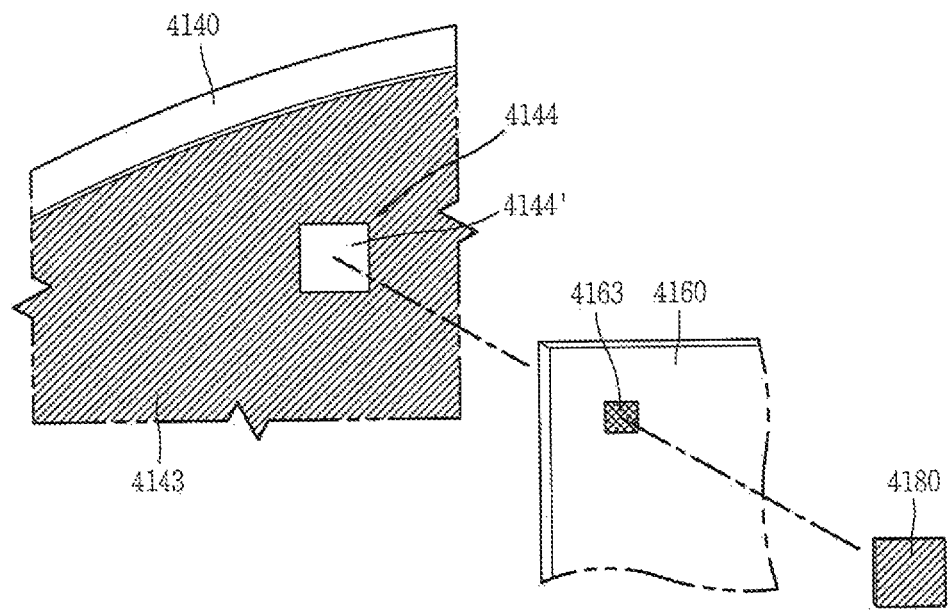
FIG. 13 is a conceptual view illustrating a second exemplary embodiment of a structure to align a door cover with a touch sensor illustrated in FIG. 11.

Referring to FIG. 13, the guide mark 144 may be a transparent portion 4144' which may be distinguished from an opaque region 4143. The transparent portion 4144' may be excluded upon forming the opaque region 4143. For example, the transparent portion 4144' may be excluded upon printing an opaque material to form the opaque region 4143 on a rear surface of a door cover 4140 [see the description related to the shielding layer 140b (FIG. 6)], namely, a portion on which only the transparent cover body 140a is left.

When an align mark 4163 is arranged within the transparent portion 4144', the touch sensor 4160 may be aligned with the door cover 4140. That is, when the front surface of the touch sensor 4160 is attached to the rear surface of the door cover 4140, the align mark 4163 may be arranged within the transparent portion 4144' in an overlapping manner.

Since the guide mark 4144 corresponds to the entire transparent portion 4144', the align mark 4163 which is arranged within the transparent portion 4144' in the overlapping manner may be externally exposed through the transparent door cover 4140. In the structure, the align mark 4163 may have the same color tone as the opaque region 4143 such that it can be difficult for a user to recognize the align mark 4163.

In this manner, when the guide mark 4144 is configured fully as the transparent portion 4144', a size of the guide mark 4144 may be reduced. Also, since the align mark 4163 is aligned within the transparent portion 4144' in the overlapping manner, the alignment may be more easily facilitated. When the touch sensor 4160 is attached to the door cover 4140, an opaque shielding member 4180 may be attached to the rear surface of the touch sensor 160 to cover the transparent portion 4144' of the guide mark 4144.

Figure 14:
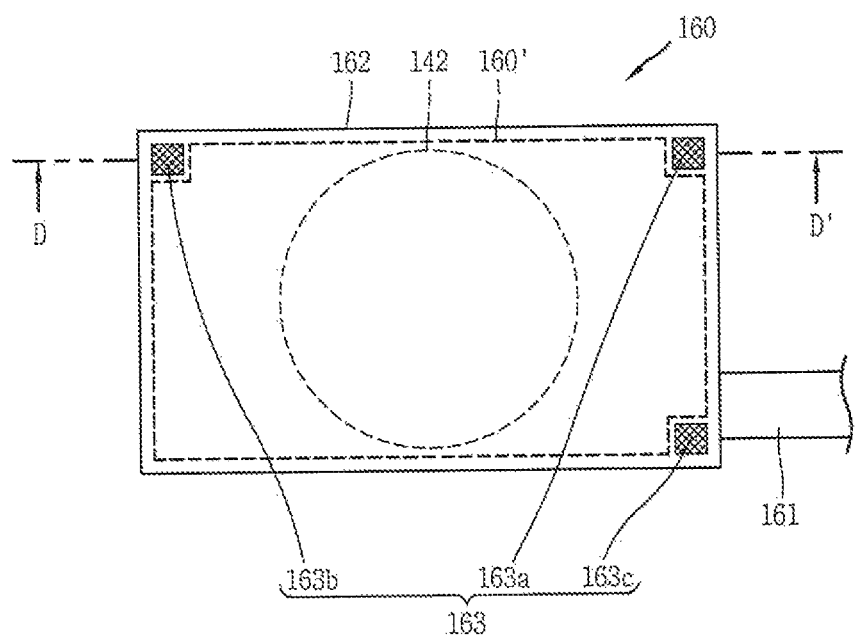
FIG. 14 is a front view of the touch sensor illustrated in FIG. 11.

As illustrated in FIG. 14, the touch sensor 160 may include a sensing region 160' sensing a touch input applied to the door cover 140, and the second transparent region 142 may be overlaid within the sensing region 160'. To sense a touch input applied to the opaque region 143 around the second transparent region 142, the sensing region 160' may overlap even the opaque region 143. In the configuration, a part of the sensing region 160' may overlap the second transparent region 142, and another part of the sensing region 160 may overlap the opaque region 143 around the second transparent region 142.

The align mark 163 provided on the touch sensor 160 may be located at a portion where the sensing region 160' is not formed. The align mark 163 may be provided on a corner portion of the touch sensor 160. The touch sensor 160 may include a flexible printed circuit board (FPCB) 161 which may serve to transmit an input signal sensed by the touch sensor 160 to a control unit. The FPCB 161 may have a shape extending from one side of a touch sensor film 162.

Figure 15:
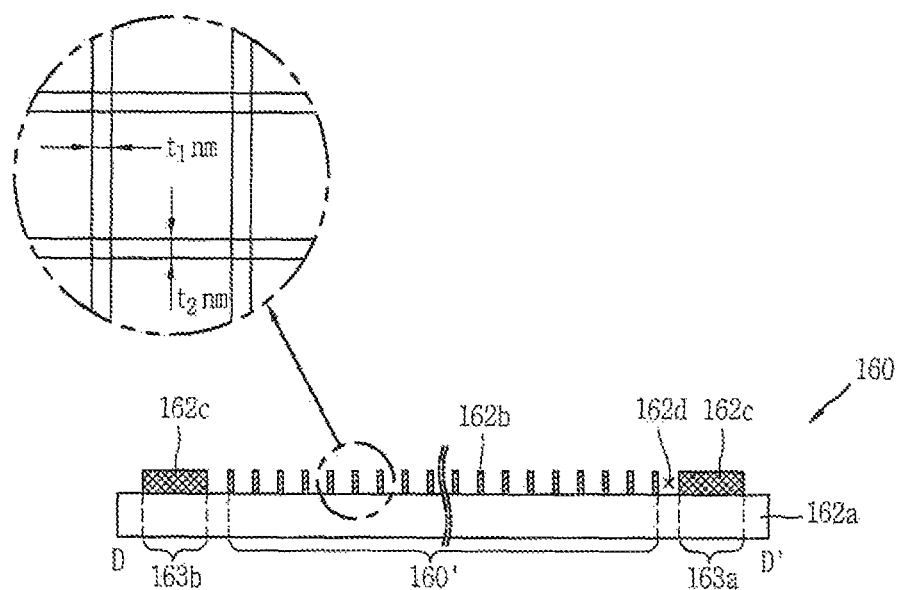
FIG. 15 is a sectional view illustrating a first exemplary embodiment of the touch sensor, taken along the line D-D' illustrated in FIG. 14.

As illustrated in FIG. 15, the touch sensor 160 may include a base portion 162a, a touch pattern portion 162b, and a mark portion 162c. The base portion 162a may define an appearance of the touch sensor 160, and be made of an insulating material. The base portion 162a may be made of a transparent material such that visual information output on the display module 130 can be transmitted therethrough.

The touch pattern portion 162b forming the sensing region 160' of a touch input may be formed on the base portion 162a. The touch pattern portion 162b may be configured in a manner that metal members extend in a first direction (x-axis) and a second direction (y-axis), respectively, to form a grid pattern. The metal member may be made of a metallic material, such as silver (Ag), copper (Cu), gold (Au), and the like.

The metallic material forming the touch pattern portion 162b may have thin line widths (t1, t2) (nano-scale). Therefore, the touch pattern portion 162b may neither be identified with the user's eyes nor interfere with visual information output from the display module 130. The metallic materials extending in the first direction and the second direction may be insulated from each other at an overlapped portion. To this end, an insulating layer may be interposed at the overlapped portion.

The touch pattern portion 162b may be electrically connected with the FPCB 161 directly or indirectly (through a separate signal transfer portion). The mark portion 162c constructing the align mark 163 [163a, 163b] may be formed on the base portion 162a. The mark portion 162c may be formed of the same material as the touch pattern portion 162b, and may be electrically separated from the touch pattern portion 162b.

The mark portion 162c and the touch pattern portion 162b may be formed during the same process, not through separate processes from each other. For example, a metallic material deposited on the base portion 162a may be divided into the touch pattern portion 162b and the mark portion 162c through masking, etching, and the like. In this instance, the mark portion 162c may be electrically separated from the touch pattern portion 162b by an etched portion 162d.

The mark portion 162c may be formed of the same metallic material as the touch pattern portion 162b, but understood as a dummy portion which is electrically separated from the touch pattern portion 162b and thus cannot sense a touch input. With the structure, the mark portion 162c may form the same layer with the touch pattern portion 162b on the base portion 162a.

The mark portion 162c may be patterned to have a predetermined area, and configured to be identified with the user's eyes, unlike the metal member constructing the touch pattern portion 162b. The mark portion 162c may have an opaque property, and as aforementioned, may have a different color tone from the opaque portion 144" [the first embodiment related to FIG. 12] or have the same color tone as the opaque region 4143 [the second embodiment related to FIG. 13].

This structure may provide a simple layered structure in view of forming the pattern portion 162b and the mark portion 162c using the single metallic material. Also, the structure may use a relatively cheap metallic material, and thus have an advantage of substituting an ITO transparent electrode containing indium which is a high-priced rare metal called a rare earth metal.

Figure 16:
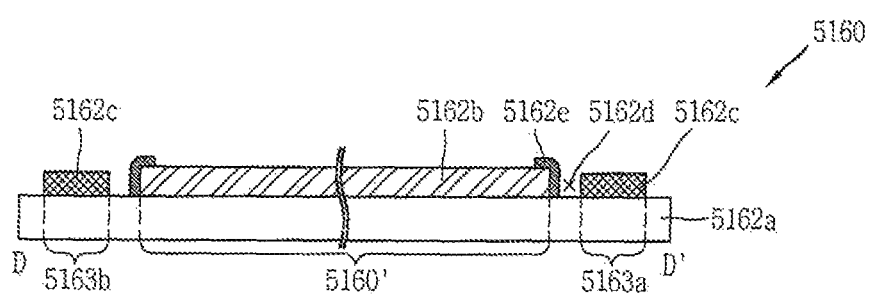
FIG. 16 is a sectional view illustrating a second exemplary embodiment of the touch sensor, taken along the line D-D' illustrated in FIG. 14.

As illustrated in FIG. 16, a touch sensor 5160 may include a base portion 5162a, a touch pattern portion 5162b, a signal transfer portion 5162e, and a mark portion 5162c. The base portion 5162a may define an appearance of the touch sensor 5160, and may be made of an insulating material. The base portion 5162a may be formed of a transparent material such that visual information output on the display module 5130 may be transmitted therethrough.

The touch pattern portion 5162b forming a sensing region 5160' of a touch input may be formed on the base portion 5162a. The touch pattern portion 5162b may be implemented in a manner of depositing a transparent conductive film, such as indium tin oxide (ITO), carbon nano tube (CNT) and the like, on the base portion 5162a.

The touch pattern portion 5162b may include first and second pattern layers which extend in a first direction (x-axis) and a second direction (y-axis), respectively, to construct sensing channels. This drawing conceptually illustrates the touch patter layer for easily describing a connection between the touch pattern portion 5162b and the signal transfer portion 5162e.

The touch pattern portion 5162b may be connected with the signal transfer portion 5162e, and the signal transfer portion 5162e may be connected with the FPCB 5161. The signal transfer portion 5162e may electrically connect the touch patter portion 5162*b* with the FPCB 5161, to transfer a touch input signal which is sensed by the touch pattern portion 5162*b*. The signal transfer portion 5162*e* may be made of a colored material, but may not be externally exposed by being obscured by the opaque region 5143 of the door cover 5140.

The mark portion 5162*c* forming marks 5163*a* and 5163*b* may be formed on the base portion 5162*a*. The mark portion 5162*c* may be electrically separated from the touch pattern portion 5162*b* and the signal transfer portion 5162*e*. The mark portion 5162*c* may have a predetermined area, and thus be visibly recognizable by the user, unlike the touch pattern portion 5162*b*. The mark portion 5162*c* may have an opaque property, and as aforementioned, have a different color tone from that of the opaque portion 144" [the first embodiment related to FIG. 12] or have the same color tone as that of the opaque region 4143 [the second embodiment related to FIG. 13].

The mark portion 5162*c* may be made of the same material as the signal transfer portion 5162*e*, but may be electrically separated from the signal transfer portion 5162*e*. The mark portion 5162*c* and the signal transfer portion 5162*e* may be formed during the same process, other than through separate processes. For example, a metal material deposited on the base portion 5162*a* may be divided into the signal transfer portion 5162*e* and the mark portion 5162*c* through processes such as masking, etching, and the like. In this instance, the mask portion 5162*c* may be electrically separated from the signal transfer portion 5162*e* by an etched portion 5162*d*.

The mark portion 5162*c* may be made of a different material from the signal transfer portion 5162*e* and formed through different processes. The touch sensor 5160 with the align marks 5163*a* and 5163*b* may be fabricated through a simple process of forming the mark portion 5162*c* on the pre-fabricated touch sensor 5160.

Figure 17:
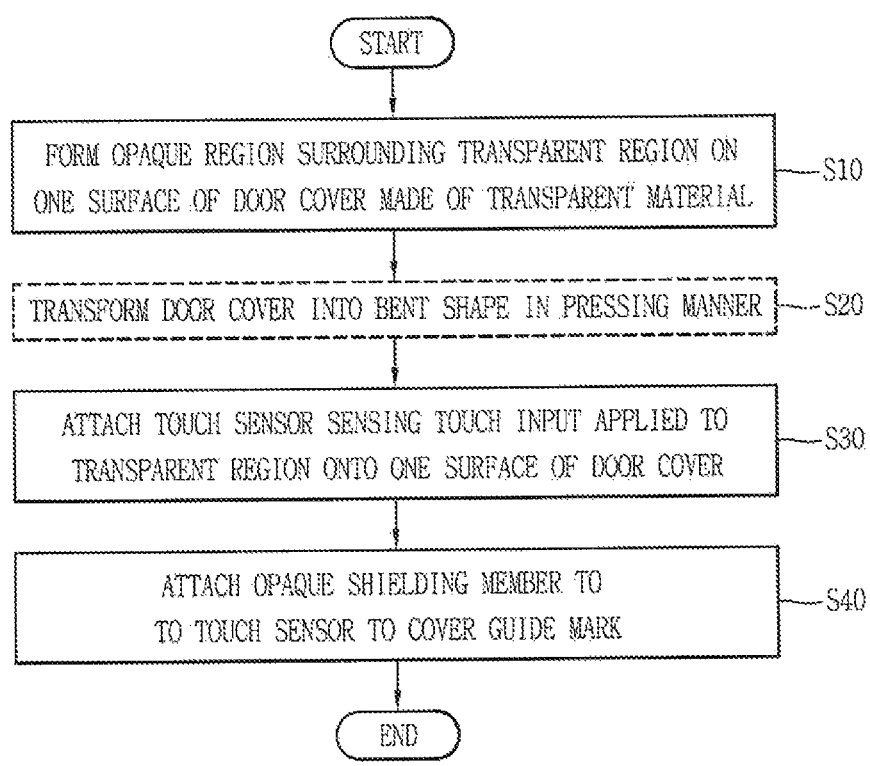
FIG. 17 is a flowchart illustrating a method of coupling the door cover and the touch sensor illustrated in FIG. 11.

Referring to FIG. 17, to fabricate the door cover 140, an opaque region 143 surrounding the second transparent region 142 may first be formed on a first surface of the door cover 140, which is made of a transparent material (S10). As aforementioned, in order to form the second transparent region 142 and the opaque region 143 on the door cover 140, an opaque material may be printed on one surface of the door cover 140, or a film with the opaque portion 144" thereon may be attached to the one surface of the door cover 140.

Next, the touch sensor 160 sensing a touch input applied to the second transparent region 142 may be attached to the first surface of the door cover 140 (S30). The step of attaching the touch sensor 160 may include aligning the align mark 163 of the touch sensor 160 to be overlaid within the guide mark 144 formed on the opaque region 143. The align mark 163 may be aligned within the guide mark 144 through specialized steps, as follows.

Figure 18:
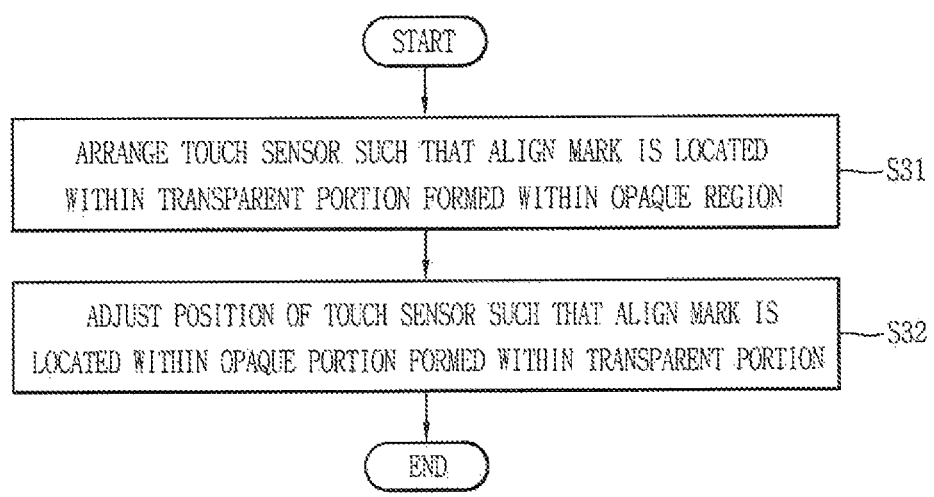
FIG. 18 is a flowchart illustrating a detailed step of attaching the touch sensor to the door cover in the structure illustrated in FIG. 12.

Referring to FIG. 18, the touch sensor 160 may be aligned in a manner that the align mark 163 is located within the transparent portion 144' of the guide mark 144 (S31). Afterwards, the location of the touch sensor 160 may be adjusted such that the align mark 163 is located in the opaque portion 144" formed within the transparent portion 144' (S32). The location of the touch sensor 160 may be precisely adjusted such that the aforementioned first to third align marks 163*a*, 163*b* and 163*c* are located within the opaque portions 144" of the first to third guide marks 144*a*, 144*b* and 144*c*, respectively.

The alignment may be realized by adjusting the location of the touch sensor 160 while the user visually checks it or uses a device to measure alignment, or in a completely automatic manner by using a device. After the touch sensor 160 is attached to the door cover 140, the opaque shielding member 180 may be attached to the touch sensor 160 to cover the guide mark 144 (S40). The display module 130 may then cover the second transparent region 142 of the door 10, thereby completely fabricating the touch screen 12.

The door cover 140 may have at least a portion formed in a bent shape. After forming the opaque region 143, and before attaching the touch sensor 160 to the door cover 140, the door cover 140 may be bent by pressing the door cover 140 (S20).

Figure 19:
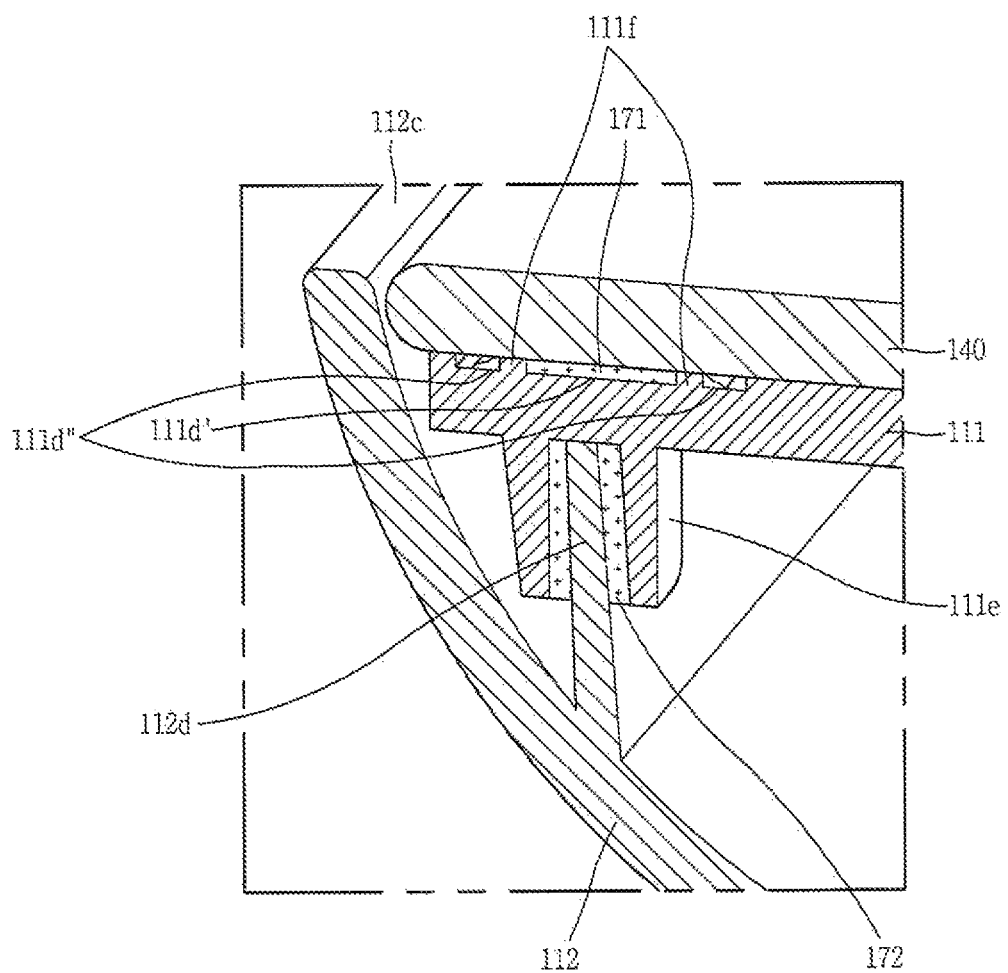
FIG. 19 is a sectional view taken along the line E-E' illustrated in FIG. 4.

As illustrated in FIG. 19, the door cover 140 may be coupled to the door frame 110. As aforementioned, the door frame 110 may include the outer frame 111 and the inner frame 112.

The door cover 140 may be attached to a front surface of the outer frame 111. The inner frame 112 may be coupled at a rear side of the outer frame 111. The coupling between the outer frame 111 and the inner frame 112 may be implemented in a screw-coupling, hook-coupling, or bonding manner.

FIG. 19 illustrates a coupled structure between the outer frame 111 and the inner frame 112 in the bonding manner. A coupling rib 112*d* may protrude from the inner frame 112 and a rib accommodating portion 111*e* in which the coupling rib 112*d* is accommodated may protrude from a rear surface of the outer frame 111, and a bonding member 172 may be filled in the rib accommodating portion 111*e*.

When the outer frame 111 and the inner frame 112 are coupled to each other, an outer circumferential portion of the inner frame 112 may protrude at a front surface of the outer frame 111, thereby forming a mounting guide 112*c*. The mounting guide 112*c* may extend in a loop shape along a circumference of the outer frame 111, to form a space in which the door cover 140 may be accommodated.

The mounting guide 112*c* may to cover a side surface of the door cover 140, and protrude to a predetermined height such that an upper surface of the mounting guide 112*c* is flush with the upper surface of the adjacent door cover 140. With the configuration, a step between the mounting guide 112*c* and the door cover 140 may be reduced, thereby implementing a more simplified appearance.

In general, portions with unique shapes (e.g., vertex (or corner) portions, recessed portions, etc.) may serve as reference points for fixing (aligning) an installation location during an assembly process to facilitate the assembly process. However, when the door cover 140 is formed in the circular shape, since an edge portion of the door cover 140 is rounded, it may not be easy to find an appropriate portion for fixing (aligning) the installation location during the assembly process. Specifically, if the door cover 140 is not coupled to an accurate position on the door frame 110, the first and second transparent regions 141 and 142 of the door cover 140 may not correspond to or may be misaligned with the first and second opening portions 110*a* and 111*b* of the door frame 110.

Figure 20:
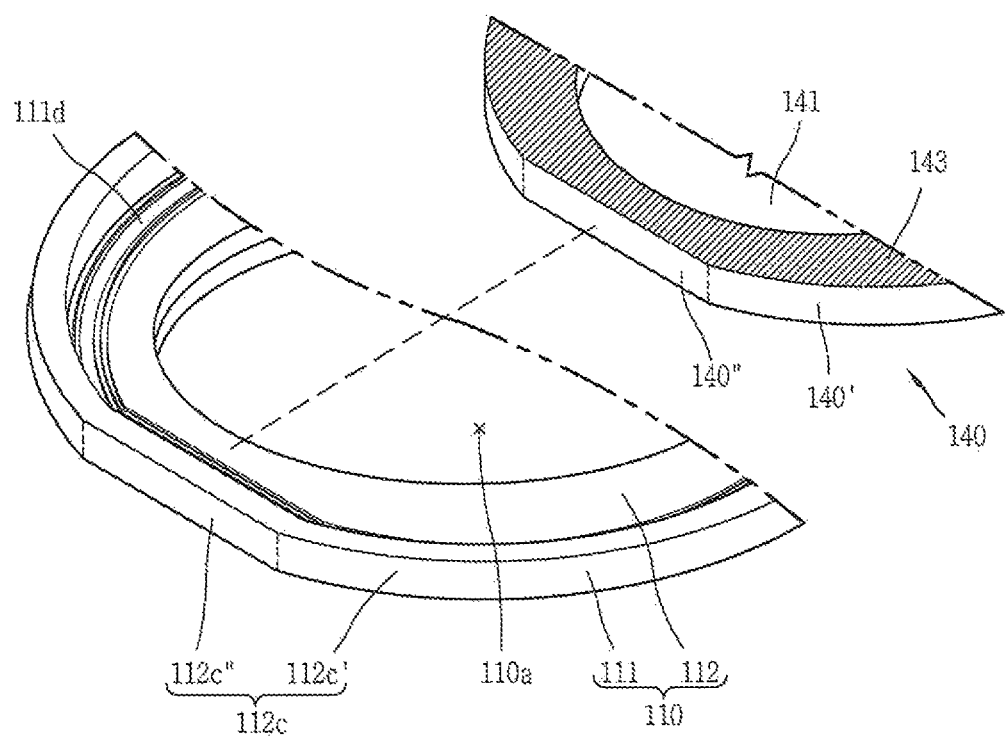
FIG. 20 is a conceptual view illustrating the door cover and a door frame in a separated state at a part F illustrated in FIG. 4.

As such, as illustrated in FIG. 20, the door cover 140 may have a reference portion (fitting point) to align an installation position upon being assembled with the door frame 110. The door cover 140 may include a first edge portion 140' rounded into a circular shape, and a second edge portion 140" linearly connecting both sides of the first edge portion 140'. The door cover 140 may thus have a circular shape with a portion cut off into a linear shape. The aforementioned mounting guide 112*c* may also include a first protruding portion 112*c*' that corresponds to the first edge portion 140', and a second protruding portion 112c" that corresponds to the second edge portion 140".

The second edge portion 140" and the second protruding portion 112c" may become fitting points to align installation positions of the door cover 140 and the door frame 110 upon assembling them with each other. When the second edge portion 140" corresponds to the second protruding portion 112c", the door cover 140 may be located at a fixed position on the door frame 110. This may allow the first and second transparent regions 141 and 142 of the door cover 140 to be aligned with the first and second opening portions 110a and 111b of the door frame 110.

Also, as the door cover 140 is located at the fixed position on the door frame 110, the touch sensor 160 attached to the door cover 140 and the display module 130 coupled to the door frame 110 may be aligned with each other. This may ensure reliability of the touch screen 12.

The second protruding portion 112c" may be located at any position of the door frame 110. However, the second protruding portion 112c" may preferably be formed at a lower side of the door frame 110 such that the user may not easily recognize that the door 10 has a circular shape with a partially-cut portion.

Meanwhile, still referring to FIG. 20 along with FIG. 19, the door cover 140 may be coupled to the door frame 110 using a liquid sealant 171. A sealant filling groove 111d in which the sealant 171 is received may be formed at a front surface of the outer frame 111. The sealant filling groove 111d may include a sealant filled portion 111d' and a sealant collecting portions 111d". The sealant filled portion 111d', which is a portion that receives the sealant 171 therein, may surround the first opening portion 110a and the second opening portion 111b.

The sealant collecting portions 111d" that collect the sealant 171 discharged to inner and outer sides of the sealant coating portion 111d" may be provided at both sides of the sealant filled portion 111d', respectively. The sealant collecting portions 111d" may extend in parallel along the sealant filled portion 111d' while being spaced apart from the sealant filled portion 111d' by a predetermined distance. The sealant collecting portions 111d" may have a narrower width than the sealant filled portion 111d'.

Jaws 111f may protrude between the sealant filled portion 111d' and the sealant collecting portions 111d" at a predetermined height. The jaws 111f may protrude so that a top surface of the jaws 111f correspond to the front surface of the outer frame 111. In this instance, the jaws 111f may function as support surfaces to support the door cover 140.

Even though the sealant 171 filled in the sealant filled portions 111d' may be leaked out during the process of coupling the door cover 140 to the outer frame 111, the leaked sealant 171 may be collected in the sealant collecting portions 111d" provided at the inner and outer sides of the sealant filled portion 111d', respectively. This may result in preventing quality of appearance from being lowered due to the leaked sealant.

The sealant filled portion 111d' may be as close as possible to the edge portion of the outer frame 111. Therefore, a non-bonded portion of the edge portion of the door cover 140 may be minimized, which may result in increasing bonding strength and effectively preventing an introduction of foreign materials through a gap between the door cover 140 and the outer frame 111.

Figure 21:
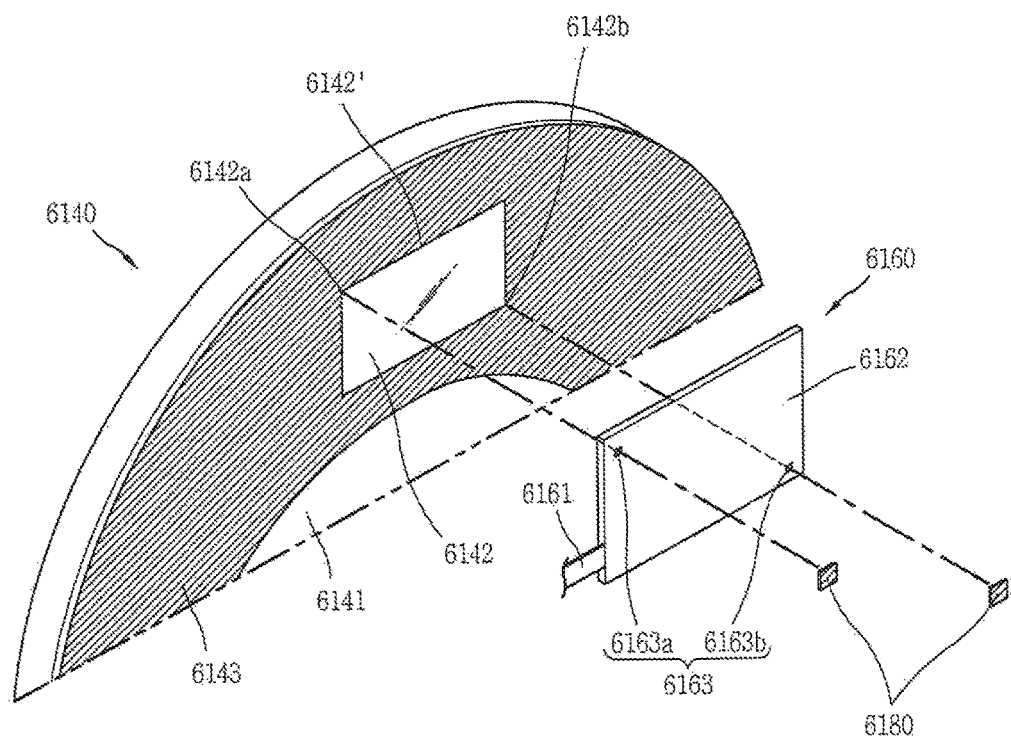
FIGS. 21 to 24 are conceptual views illustrating variations of an arrangement structure of a touch sensor with respect to a door cover.

Referring to FIG. 21, an align mark 6163 to attach the touch sensor 6160 to a correct position on a second transparent region 6142 may be provided on the touch sensor 6160. Unlike the foregoing embodiments, this variation may not employ a separate guide mark on the door cover 6140, but may have a boundary between the second transparent region 6142 and an opaque region 6143 formed on a door cover 6140 may serve as a reference for settling the position of the align mark 6163.

The align mark 6163 may be aligned based on the boundary between the second transparent region 6142 and the opaque region 6143, such that the touch sensor 6160 may be attached to the correct position of the door cover 6140. The boundary used for the alignment may be a boundary line between the second transparent region 1642 and the opaque region 6143, a corner of the second transparent region 6142, or the like. The touch sensor 6160 and the second transparent region 6142 may have rectangular shapes which correspond to the rectangular display module.

The touch sensor 6160 may be larger than the second transparent region 6142 to cover the second transparent region 6142 formed on the door cover 6140. Therefore, a first part of the touch sensor 6160 may cover the second transparent region 6142, and a second part of the touch sensor 6160 may to cover the opaque region 6143 around the second transparent region 6142. The align mark 6163 may be formed on the second part of the touch sensor 6160 which covers the opaque region 6143.

The align mark 6163 may have various forms, such as a point, a line, or the like. As illustrated in this variation, when the align mark 6163 is a point, align points 6163a and 6163b may be provided at least two positions in a spaced manner. The align points 6163a and 6163b may be formed on corner portions of the touch sensor which do not correspond to the second transparent region 6142. The align points 6163a and 6163b may be positioned at least two corner portions of the touch sensor 6160.

As the align points 6163a and 6163b correspond to the corners of the second transparent region 6142, the touch sensor 6160 may be attached to the correct position of the door cover 6140. The align points 6163a and 6163b may overlap the opaque region 6143 limiting the corners. In this instance, the align points 6163a and 6163b may not be exposed through the second transparent region 6142, which is advantageous in that a shielding member 6180 to may not be needed.

In this instance, the align points 6163a and 6163b may have a different color tone from the opaque region 6143, to be visually distinguished within the opaque region 6143. For example, when the opaque region 6143 has a black color tone, the align points 6163a and 6163b may have a color such as gray, white, yellow, except for the black color tone.

The align points 6163a and 6163b may also overlap the second transparent region 6142 forming the corners. In this instance, the align points 6163a and 6163b may be externally exposed through the second transparent region 6142, thereby lowering attraction of the appearance.

In order for the align points 6163a and 6163b to be invisible, opaque shielding members 6180 may cover the touch sensor 6160 to shield the align points 6163a and 6163b. The shielding members 6180 may shield both the align points 6163a and 6163b and the opaque region 6143 adjacent to the align points 6163a and 6163b.

The shielding members 6180 may have the same color tone as the align points 6163a and 6163b such that the align points 6163a and 6163b are invisible therethrough. Also, the shielding members 6180 may have the same color tone as the opaque region 6143 to give a feeling as though the opaque region 6143 extends.

The shielding members 6180 may be provided within the second transparent region 6142 to overlap the align points

6163*a* and 6163*b*. The shielding members 6180 may correspond to the align points 6163*a* and 6163*b*, or extend along at least one side of the second transparent region 6142.

Figure 22:
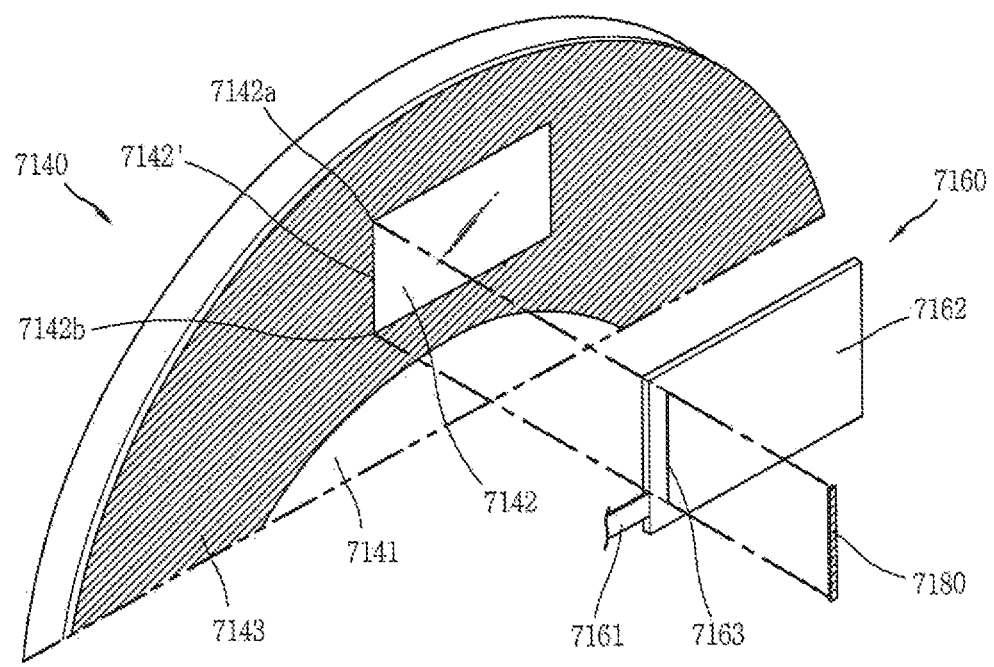

FIG. 22 illustrates that an align mark 7163 may be in the form of a line. The align line 7163 may extend along at least one side of a touch sensor 7160. The align line 7163 may be formed at an edge portion of the touch sensor 7160 which does not correspond to a second transparent region 7142. The align line 7163 may be along a left edge of the touch sensor 7160.

Figure 23:
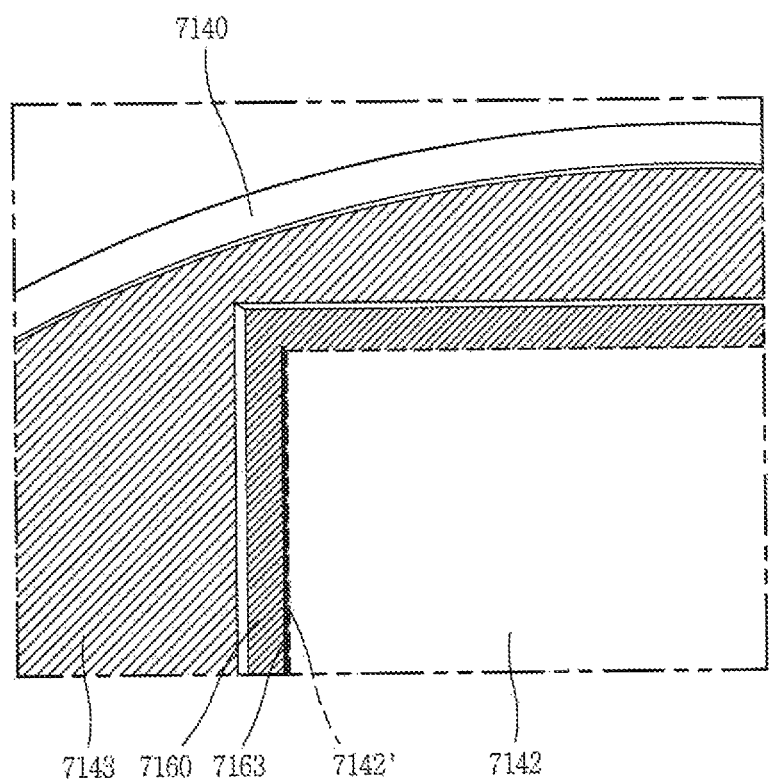

As the align line 7163 is located to correspond to a boundary 7142' between the second transparent region 7142 and the opaque region 7143, the touch sensor 7160 may be attached to a correct position of the door cover 7140. As illustrated in FIG. 23, the align line 7163 may overlap the opaque region 7143 which forms the boundary 7142' between the second transparent region 7142 and the opaque region 7143. In this instance, the align line 7163 may not be exposed through the second transparent region 7142, which is advantageous in that a shielding member 7180 to be explained later may not be needed.

The align line 7163 may be formed with a different color tone from the opaque region 7143, to be visually distinguished within the opaque region 7143. For example, when the opaque region 7143 has a black color tone, the align line 7163 may have a color such as gray, white, yellow, except for the black color tone.

Figure 24:
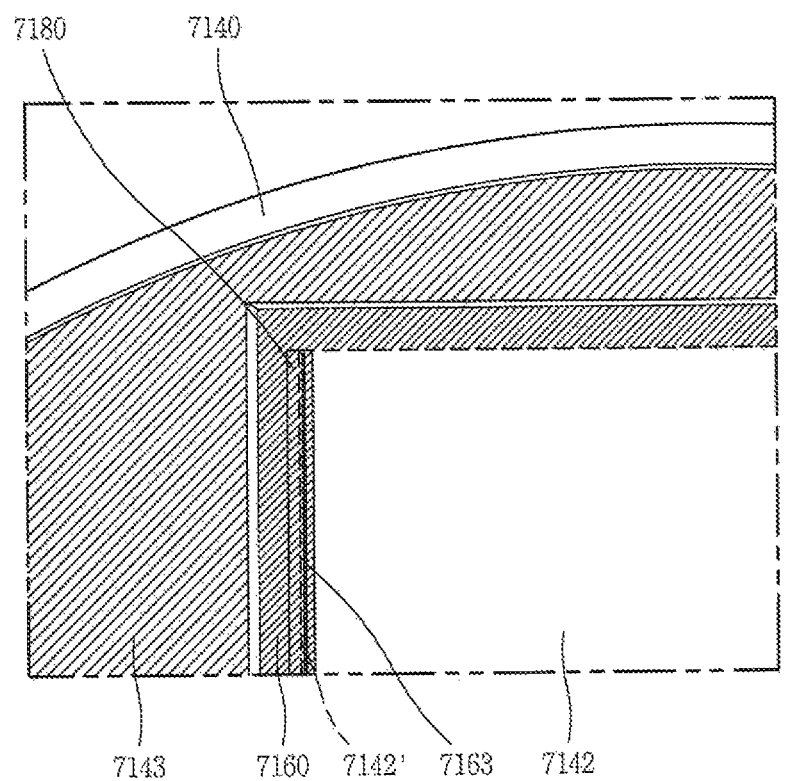

As illustrated in FIG. 24, the align line 7163 may overlap the second transparent region 7142 which forms the boundary 7142' between the second transparent region 7142 and the opaque region 7143. In this instance, the align line 7163 may be externally exposed through the second transparent region 7142, thereby lowering attraction of an appearance.

In order for the align line 7163 to be invisible, an opaque shielding member 7180 may cover the touch sensor 7160 to shield the align line 7163. The shielding member 7180 may cover both the align line 7163 and the opaque region 7143 adjacent to the align line 7163.

The shielding member 7180 may be formed with the same color tone as that of the align line 7163 such that the align line 7163 is invisible therethrough. Also, the shielding member 7180 may be formed with the same color tone as the opaque region 7143 to give a feeling as though the opaque region 7143 extends.

The shielding member 7180 may be provided within the second transparent region 7142 to overlap the align line 7163. The shielding member 7180 may extend along at least one side of the second transparent region 7142.

In those variations, the align marks 6163 and 7163 may be formed by the mark unit 162*c*, 5162*c*. Therefore, redundant description thereof will be omitted.

A laundry treating apparatus may include a main body having a laundry introduction opening, and a door capable of opening and closing the laundry introduction opening, wherein the door includes a door cover defining an appearance of the door, and provided with a transparent region, and an opaque region surrounding the transparent region, a display module disposed on a rear surface of the door cover, and capable of outputting visual information through the transparent region, and a touch sensor attached to a rear surface of the door cover to cover the transparent region and capable of sensing a touch input applied to the transparent region, wherein the touch sensor is provided with an align mark to allow the touch sensor to be attached to a correct position with respect to the transparent region. The align mark may include at least two align points formed at corner portions of the touch sensor, respectively.

The align mark may include an align line extending along at least one side of the touch sensor. The touch sensor may include a base portion made of a transparent material, a touch pattern portion patterned into a preset pattern on the base portion to sense a touch input applied to the door cover, and a mark portion formed on the base portion and forming the align mark. The mark portion may be made of the same material as the touch pattern portion, but is electrically separated from the touch pattern portion.

The touch sensor may further include a signal transfer portion electrically connected to the touch pattern portion to form a signal transfer path. The mark portion may be made of the same material as the signal transfer portion and electrically separated from the signal transfer portion.

The door cover may include a cover body made of a transparent material, and a shielding layer that covers a rear surface of the cover body and forms the opaque region. The transparent region may be a portion where the shielding layer is not provided. The door cover may include a cover body made of a transparent material, and a film attached to a rear surface of the cover body, and the film may include a transparent portion corresponding to the transparent region, and an opaque portion formed to surround the transparent portion and corresponding to the opaque region.

A method for fabricating a door of a laundry treating apparatus may include forming an opaque region on one surface of the door cover made of a transparent material in a manner of surrounding a transparent region, and attaching a touch sensor on one surface of the door cover, the touch sensor sensing a touch input applied to the transparent region, wherein the attaching the touch sensor includes aligning an align mark of the touch sensor based on a boundary between the opaque region and the transparent region. The aligning may be configured such that the align mark is located to overlap the opaque region forming the boundary. In this instance, the align mark may have a different color tone from the opaque region.

The aligning may be configured such that the align mark is located to overlap the transparent region forming the boundary. In this instance, the fabricating method may further include after the attaching the touch sensor, attaching an opaque shielding member onto the touch sensor so as to cover the align mark. The shielding member may overlap the transparent region. The shielding member may have the same color tone as the opaque region.

The fabricating method may further include arranging a display module to cover the transparent region after attaching the shielding layer. The fabricating method may further include transforming the door cover into a bent shape in a pressing manner after forming the opaque region.

A mounting guide of a door frame may include a first protruding portion in a rounded shape and a second protruding portion in a linear shape which correspond to first and second edge portions of a door cover, respectively. Accordingly, upon assembling the door cover with the door frame, the second edge portion and the second protruding portion may function as fitting points to align an installation position. When the second edge portion is arranged to correspond to the second protruding portion, the door cover may be located at a fixed position on the door frame, and thus first and second transparent regions of the door cover can be arranged to be aligned with first and second opening portions of the door frame. In this manner, the door cover can be located at the fixed position on the door frame, which may result in allowing the alignment between the touch sensor attached to the door cover and a display module coupled to the door frame.

When a touch pattern portion of a touch sensor is formed in a structure of a metal mesh, a mark portion may be made of the same metallic material as a touch pattern portion, but may be electrically separated from the touch pattern portion to form a dummy portion where a touch input is not sensed. A simple layered structure may be realized in view of forming the touch pattern portion and the mark portion using a single metallic material, and the mark portion and the touch pattern portion may be formed during the same process.

When a touch sensor includes a touch pattern portion using ITO and the like, and a signal transfer portion, the touch sensor may have the following structure. The mark portion may be formed of the same material as the signal transfer portion but may be electrically separated from the signal transfer portion. In this instance, the mark portion and the signal transfer portion may be formed during the same process, other than through separate processes.

The mark portion may also be made of a different material from the signal transfer portion and thus the mark portion and the signal transfer portion may be formed through different processes. In this instance, a touch sensor having an align mark may be fabricated through a simple process of forming the mark portion on a pre-fabricated touch sensor.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A laundry treating apparatus, comprising:
   a main body having a laundry introduction opening; and
   a door configured to open or close the laundry introduction opening,
   wherein the door includes:
      a door cover defining an appearance of the door, and having a transparent region and an opaque region surrounding the transparent region;
      a display module provided on a rear surface of the door cover and to output visual information through the transparent region; and
      a touch sensor attached to a rear surface of the door cover to cover the transparent region and to sense a touch input applied to the transparent region,
   wherein the touch sensor has an align mark to allow the touch sensor to be attached to a correct position with respect to the transparent region,
   wherein the align mark is arranged in an overlapping manner on the transparent region forming a boundary between the opaque region and the transparent region, in a state where a front surface of the touch sensor has been attached to the rear surface of the door cover,
   wherein an opaque shielding member is attached to a rear surface of the touch sensor to entirely cover the align mark and the opaque region adjacent to the align mark together, and
   wherein the align mark and the shielding member exposed to outside through the front surface of the door cover have the same color tone as the opaque region.

2. The apparatus of claim 1, wherein the align mark includes an align line extending along at least one side of the touch sensor.

3. The apparatus of claim 2, wherein touch sensor comprises:
   a base portion made of a transparent material;
   a touch pattern portion patterned into a preset pattern on the base portion to sense a touch input applied to the door cover; and
   a mark portion formed on the base portion that forms the align mark.

4. The apparatus of claim 3, wherein the mark portion is made of the same material as the touch pattern portion, but is electrically separated from the touch pattern portion.

5. The apparatus of claim 3, wherein the touch sensor further includes a signal transfer portion electrically connected to the touch pattern portion to form a signal transfer path, and
   wherein the mark portion is made of the same material as the signal transfer portion and is electrically separated from the signal transfer portion.

6. The apparatus of claim 1, wherein the door cover includes:
   a cover body made of a transparent material; and
   a shielding layer that covers a rear surface of the cover body, and forms the opaque region.

7. The apparatus of claim 6, wherein the shielding layer is not provided on the transparent region.

8. The apparatus of claim 1, wherein the door cover includes:
   a cover body made of a transparent material; and
   a film attached to a rear surface of the cover body,
   wherein the film includes:
      a transparent portion corresponding to the transparent region; and
      an opaque portion corresponding to the opaque region and surrounding the transparent portion.

* * * * *